United States Patent

Hiroi et al.

[11] Patent Number: 5,986,263
[45] Date of Patent: Nov. 16, 1999

[54] ELECTRON BEAM INSPECTION METHOD AND APPARATUS AND SEMICONDUCTOR MANUFACTURING METHOD AND ITS MANUFACTURING LINE UTILIZING THE SAME

[75] Inventors: Takashi Hiroi; Maki Tanaka; Masahiro Watanabe, all of Yokohama; Asahiro Kuni, Tokyo; Yukio Matsuyama; Yuji Takagi, both of Yokohama; Hiroyuki Shinada, Chofu; Mari Nozoe, Ome; Aritoshi Sugimoto, Tokyo, all of Japan

[73] Assignee: Hitachi, Ltd., Tokyo, Japan

[21] Appl. No.: 08/824,413

[22] Filed: Mar. 26, 1997

[30] Foreign Application Priority Data

Mar. 29, 1996 [JP] Japan .................................. 8-075846
Jul. 23, 1996 [JP] Japan .................................. 8-193143

[51] Int. Cl.[6] .................................................. H01J 37/28
[52] U.S. Cl. ........................................ 250/310; 250/307
[58] Field of Search .................................. 250/310, 397, 250/492.2

[56] References Cited

U.S. PATENT DOCUMENTS

| | | | |
|---|---|---|---|
| 2,467,224 | 4/1949 | Picard . | |
| 3,219,817 | 11/1965 | Mollenstedt . | |
| 4,443,278 | 4/1984 | Zingher | 156/64 |
| 4,453,086 | 6/1984 | Grobman | 250/307 |
| 4,675,530 | 6/1987 | Rose et al. | 250/492.2 |
| 4,933,565 | 6/1990 | Yamaguchi et al. | 250/492.21 |
| 4,939,360 | 7/1990 | Sakai | 250/251 |
| 5,401,973 | 3/1995 | McKeown et al. | 250/310 |
| 5,502,306 | 3/1996 | Meisburger et al. | 250/310 |
| 5,578,821 | 11/1996 | Meisberger et al. | 250/310 |
| 5,670,782 | 9/1997 | Sato | 250/310 |

FOREIGN PATENT DOCUMENTS 5-258703 10/1993 Japan .

Primary Examiner—Bruce C. Anderson
Attorney, Agent, or Firm—Antonelli, Terry, Stout & Kraus, LLP

[57] ABSTRACT

An electron beam inspection method and apparatus. The method includes controlling acceleration voltage of electron beam and electric field on a sample, beam current, beam diameter, image detection rate, image dimensions, precharge, discharge, or a combination of them, exposing an object to the electron beam, detecting in a sensor a physical change generated from the object, and inspecting or measuring the object on the basis of a signal representing the detected physical change. The apparatus includes an electron source (potential E2) for generating an electron beam, a deflector for scanning generated electrons, an objective lens for focusing the electron beam upon the object, a grid (potential E1) disposed between the object and the objective lens, a wafer holder (potential E0) for holding the object, a sensor for detecting generated secondary electrons, a potential controller for controlling the potential E0, E1 and E2, and a storage for storing optimum potential conditions. By changing conditions of an electron optic system such as potential E0, E1 and E2, the acceleration voltage and electric field on the object are controlled. For a material located at least in an upper layer of a plurality of materials forming the object, the secondary electron yield ratio can be made nearly unity and appropriate contrast of an obtained image can be provided with minimized influence of charge up.

21 Claims, 18 Drawing Sheets

NORMAL PATTERN

IMAGE WITH DEFECT APPEARING SMALL

IMAGE WITH DEFECT INVISIBLE

NORMAL PATTERN

SHRUNK PATTERN IMAGE

NORMAL PATTERN

IMAGE OF X SCAN

IMAGE OF Y SCAN

MASK SIGNAL OF X SCAN

MASK SIGNAL OF Y SCAN

FIG. 7
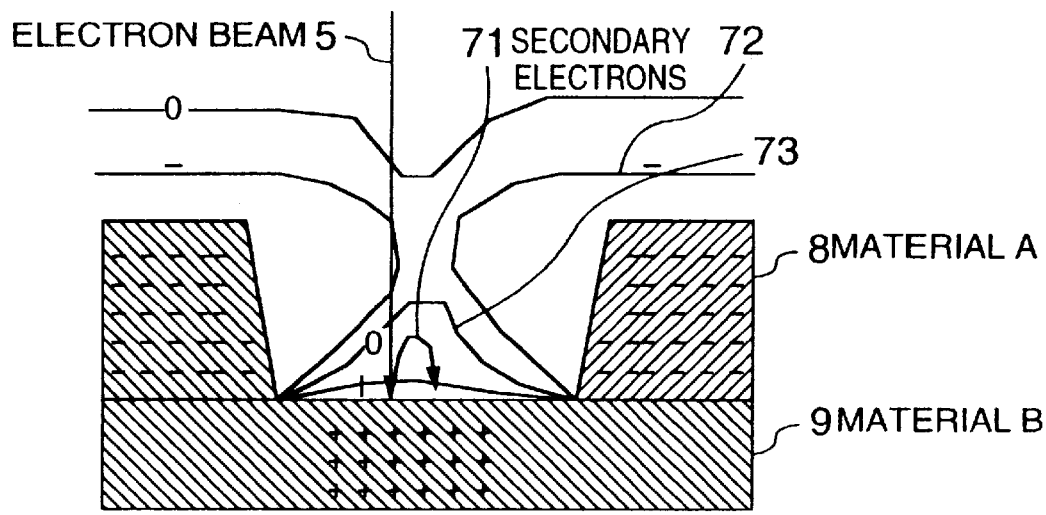
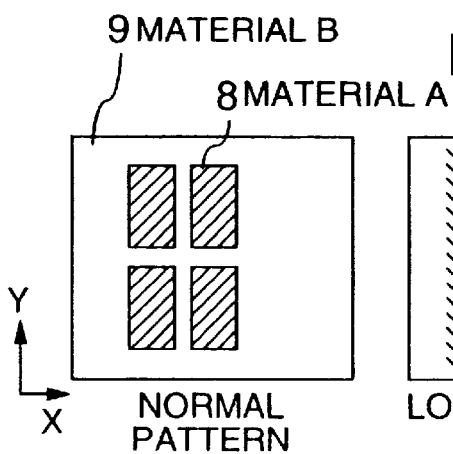
FIG. 8A
NORMAL PATTERN
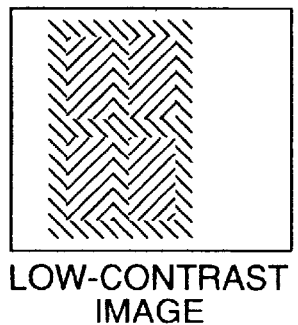
FIG. 8B
LOW-CONTRAST IMAGE
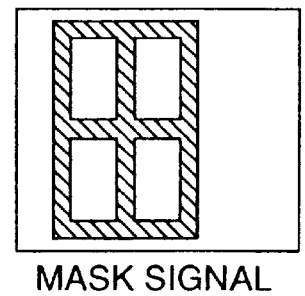
FIG. 8C
MASK SIGNAL

1 MATERIAL A
2 MATERIAL B

IMAGE DETECTED AT FIRST TIME

IMAGE DETECTED AFTER DETECTION OF PLURALITY TIMES

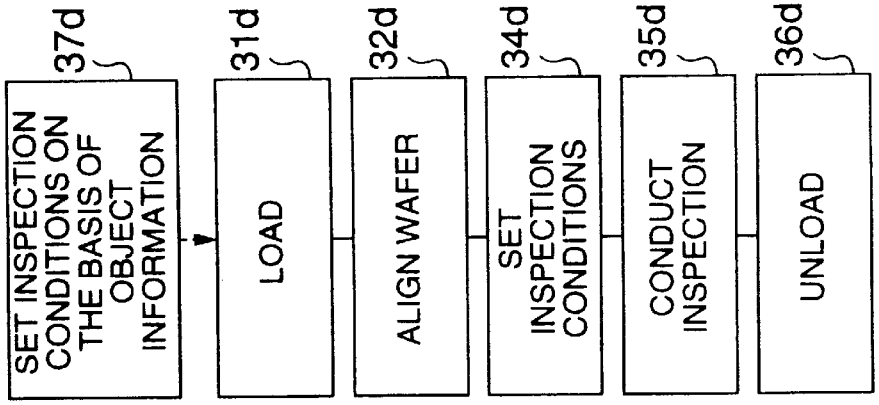
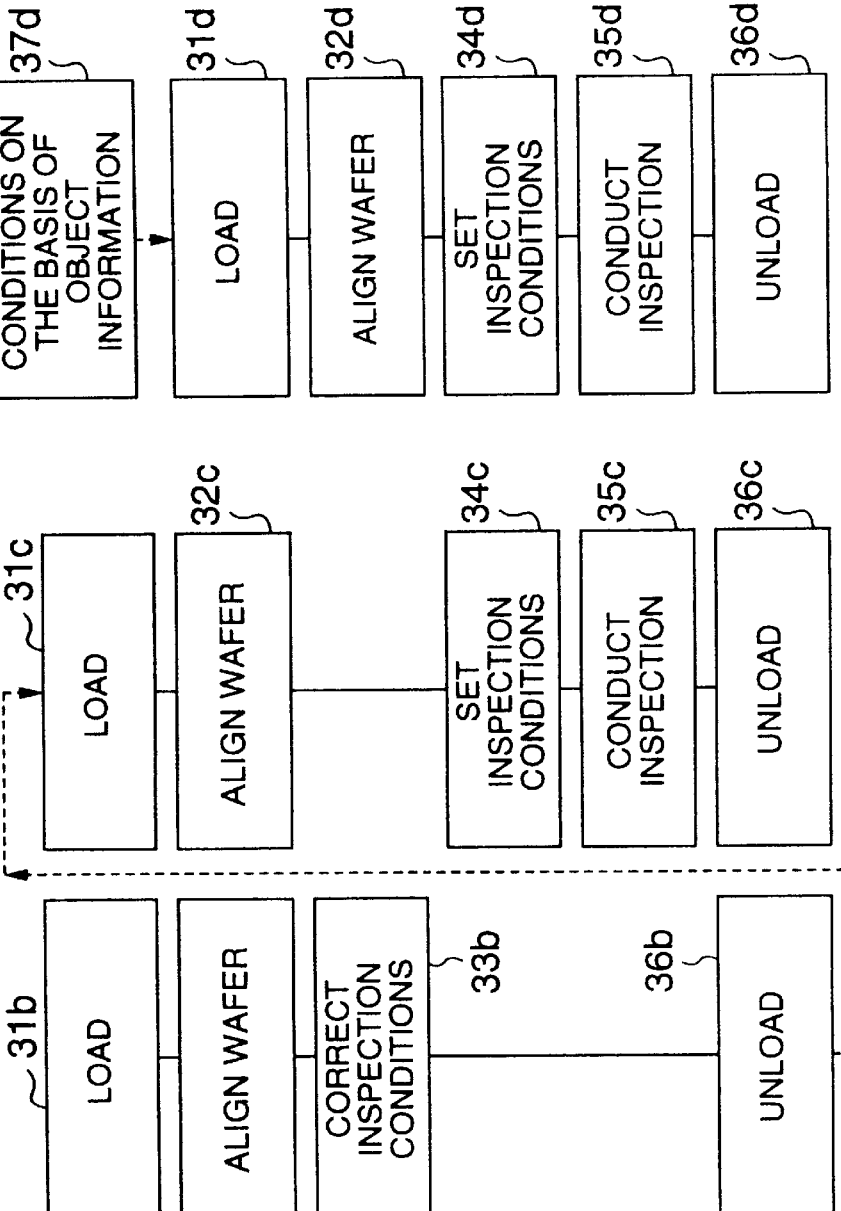
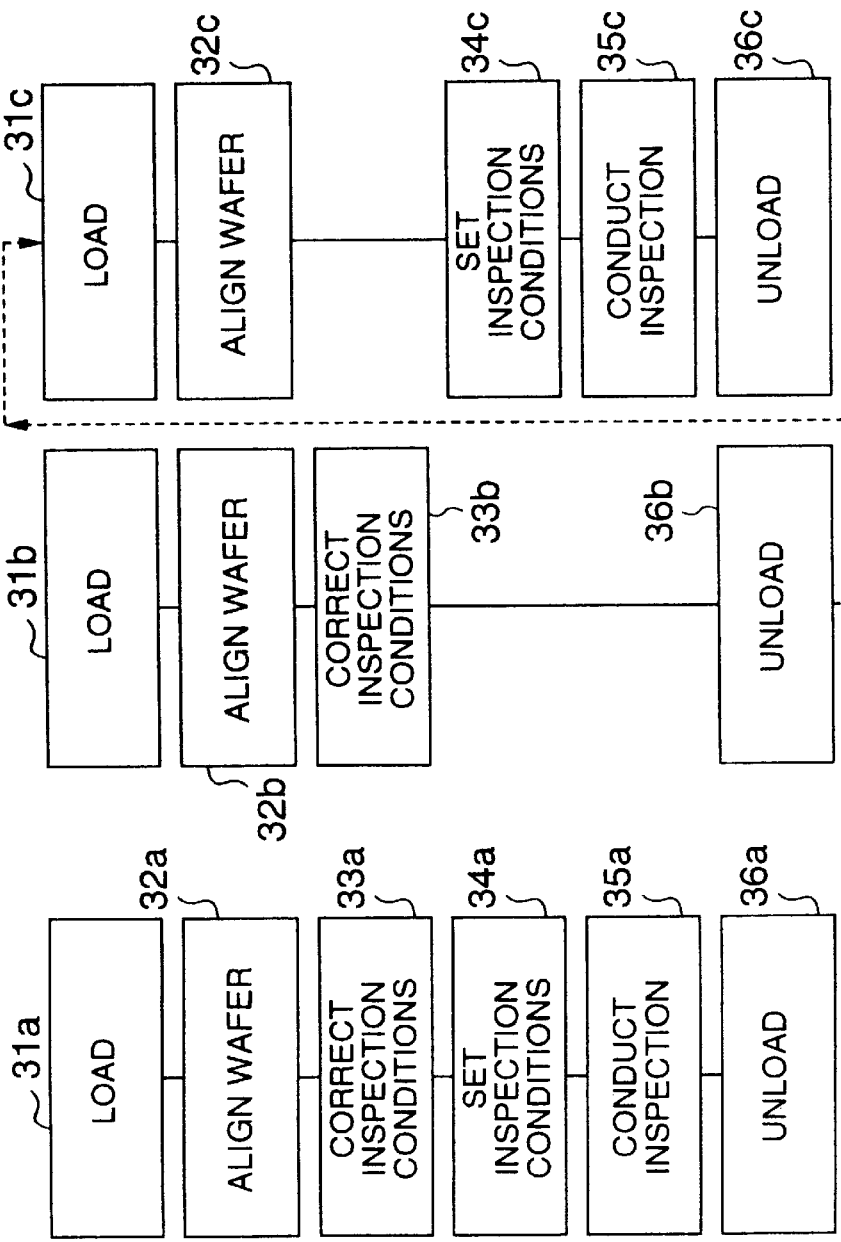

ELECTRON BEAM INSPECTION METHOD AND APPARATUS AND SEMICONDUCTOR MANUFACTURING METHOD AND ITS MANUFACTURING LINE UTILIZING THE SAME

BACKGROUND OF THE INVENTION

The present invention relates to a method and an apparatus for obtaining an image or a waveform representing a physical property of an object such as a semiconductor wafer with an electron beam, and comparing the image or waveform with design information or an image obtained beforehand to judge a defect, measure the dimension of a specific place, shape information or the fabrication condition of an object such as a semiconductor wafer, or display an image, and relates to an inspected wafer and its fabrication line in the case where the wafer is the object in the apparatus.

A conventional method using an electron beam to judge a defect, measure shape information or the fabrication condition of an object such as a semiconductor wafer, or display an image is described in JP-A-5-258703 (U.S. Pat. No. 5,502,306), for example. The conventional method includes the steps of detecting secondary electrons generated at the time of exposure with an electron beam under the same condition, conducting scanning with the electron beam, obtaining thereby an image of secondary electrons, and judging a defect on the basis of the image.

It is now assumed that an object is formed by predetermined materials A and B. In the case where a certain acceleration voltage Eb of the electron beam is used, the secondary electron yield ratio η of the material A is largely different from that of the material B. In this case, a secondary electron image contrast is obtained, and inspection between the material A and the material B is possible. In the case where a specific acceleration voltage Ea is used, however, the secondary electron yield ratio η of the material A becomes equal to that of the material B. In this case, there is little contrast in an obtained secondary electron image and the image cannot be observed. In the conventional technique, due regard is not paid to such a charge-up phenomenon for each material to be observed.

SUMMARY OF THE INVENTION

In view of the above described problem, an object of the present invention is to provide an electron beam inspection method, and apparatus, for reducing the charge-up phenomenon caused when an object is exposed to an electron beam, obtaining a high-contrast signal representing a physical property by using secondary electrons or back-scattered electrons obtained from the object, and making it possible to inspect a minute deffect at high speed and with high reliability.

Another object of the present invention is to provide an electron beam inspection method, and apparatus, for adapting the inspection condition to the charge-up phenomenon caused when an object is exposed to an electron beam, conducting inspection or measurement on the basis of an image signal representing a physical property by using secondary electrons or back-scattered electrons obtained from the object, and making it possible to inspect a minute deffect at high speed and with high reliability.

Another object of the present invention is to provide an electron beam inspection method, and apparatus, for making it possible to inspect minute resist patterns and insulator patterns which are apt to be charged, with high reliability.

A further object of the present invention is to provide a semiconductor fabrication method and its fabrication line in which minute pattern defects on a semiconductor substrate such as a semiconductor wafer are inspected to improve the yield.

In order to achieve the above described objects, in accordance with the present invention, an electron beam inspection method includes the steps of controlling an acceleration voltage of an electron beam and an electric field in neighborhood of an object, exposing the object to the electron beam with the controlled acceleration voltage, detecting in a sensor a physical change generated from the object in response to the controlled electric field, and conducting inspection or measurement of the object on the basis of a signal representing the detected physical change.

In accordance with the present invention, an electron beam inspection method includes the steps of controlling an acceleration voltage of an electron beam and an electric field in neighborhood of an object, exposing the object to the electron beam with the controlled acceleration voltage, detecting in a sensor a physical change generated from the object in response to the controlled electric field, and displaying a signal representing the detected physical change on display means.

In accordance with the present invention, a electron beam inspection method includes the steps of controlling an acceleration voltage of an electron beam and an electric field in neighborhood of an object according to a kind of a section structure on a surface of the object, exposing the object to the electron beam with the controlled acceleration voltage, detecting in a sensor a physical change generated from the object in response to the controlled electric field, and conducting inspection or measurement of the object on the basis of a signal representing the detected physical change.

In accordance with the present invention, an electron beam inspection method includes the steps of controlling an acceleration voltage of an electron beam and an electric field in neighborhood of an object according to at least a kind of a material on a surface of the object, exposing the object to the electron beam with the controlled acceleration voltage, detecting in a sensor a physical change generated from the object in response to the controlled electric field, and conducting inspection or measurement of the object on the basis of a signal representing the detected physical change.

In accordance with the present invention, an electron beam inspection method includes the steps of controlling an acceleration voltage of an electron beam and an electric field in neighborhood of an object according to a change of a section structure on a surface of the object, exposing the object to the electron beam with the controlled acceleration voltage, detecting in a sensor a physical change generated from the object in response to the controlled electric field, and conducting inspection or measurement of the object on the basis of a signal representing the detected physical change.

In accordance with the present invention, an electron beam inspection method includes the steps of controlling an acceleration voltage of an electron beam and an electric field in neighborhood of an object according to a kind or a change of a section structure on a surface of the object, exposing the object to the electron beam with the controlled acceleration voltage, detecting in a sensor a physical change generated from the object in response to the controlled electric field, and conducting inspection or measurement of the object on the basis of a signal representing the detected physical change.

In accordance with the present invention, an electron beam inspection method includes the steps of presetting a proper acceleration voltage of an electron beam and a proper electric field in neighborhood of an object so as to correspond to a charge-up phenomenon on a surface of an object, exposing the object to the electron beam in such a state that the acceleration voltage is controlled to become the preset acceleration voltage, detecting in a sensor a physical change generated from the object in response to the electric field controlled to become the preset electric field, and conducting inspection or measurement of the object on the basis of a signal representing the detected physical change.

In accordance with the present invention, an electron beam inspection method includes the steps of presetting a proper acceleration voltage of an electron beam and a proper electric field in neighborhood of an object so as to correspond to a charge-up phenomenon on a surface of an object according to a kind or a change of a section structure on the surface of the object, exposing the object to the electron beam in such a state that the acceleration voltage is controlled to become the preset acceleration voltage, detecting in a sensor a physical change generated from the object in response to the electric field controlled to become the preset electric field, and conducting inspection or measurement on the object on the basis of a signal representing the detected physical change.

In accordance with the present invention, the charge-up phenomenon is grasped as a secondary electron yield efficiency in the electron beam inspection method. Furthermore, in accordance with the present invention, the acceleration voltage of the electron beam is in the range of 0.3 to 5 kV, in the electron beam inspection method. In accordance with the present invention, the electric field in the neighborhood of the object is 5 kV/mm or less, in the electron beam inspection method.

In accordance with the present invention, an electron beam inspection method includes the steps of controlling an acceleration voltage of an electron beam on a sample, an electric field on the sample, a beam current, a beam diameter, an image detection rate (which is the clock frequency for reading image signals and which changes the beam current density), image dimensions (which is changed by changing the scan rate of the electron beam and consequently the beam current density), pre-charge (pre-charge on the sample is controlled by blowing an electron shower), discharge (discharge on the sample is controlled by blowing an ion shower), or a combination of them, exposing an object to the electron beam, detecting in a sensor a physical change generated from the object, and conducting inspection or measurement of the object on the basis of a signal representing the detected physical change.

In accordance with the present invention, an electron beam inspection method includes the steps of controlling an acceleration voltage of an electron beam on a sample, an electric field on the sample, a beam current, a beam diameter, an image detection rate (which is the clock frequency for reading image signals and which changes the beam current density), image dimensions (which is changed by changing the scan rate of the electron beam and consequently the beam current density), pre-charge (pre-charge on the sample is controlled by blowing an electron shower), discharge (discharge on the sample is controlled by blowing an ion shower), or a combination of them so as to correspond to a kind or a change of a section structure on a surface of an object, exposing the object to the electron beam, detecting in a sensor a physical change generated from the object, and conducting inspection or measurement of the object on the basis of a signal representing the detected physical change.

In accordance with the present invention, an electron beam inspection method includes the steps of exposing an object to an electron beam, detecting in a sensor a physical change generated from the object, and conducting inspection or measurement of the object on the basis of a signal representing the detected physical change under inspection conditions such as inspection conditions (including a judgment standard and a measurement standard as well) corresponding to a charge-up phenomenon on a surface of the object.

In accordance with the present invention, an electron beam inspection method includes the steps of exposing an object to an electron beam, detecting in a sensor a physical change generated from the object, and conducting inspection or measurement of the object on the basis of a signal representing the detected physical change under inspection conditions such as inspection conditions (including a judgment standard and a measurement standard as well) corresponding to a charge-up phenomenon on a surface of the object according to a kind or a change of a section structure on the surface of the object.

In accordance with the present invention, an electron beam inspection method includes the steps of exposing an object to an electron beam, detecting in a sensor a physical change generated from the object, and extracting a structural feature of the object from a signal representing the detected physical change on the basis of a feature extraction parameter corresponding to a charge-up phenomenon on a surface of the object.

In accordance with the present invention, an electron beam inspection method includes the steps of exposing an object to an electron beam, detecting in a sensor a physical change generated from the object, and extracting a structural feature of the object from a signal representing the detected physical change on the basis of a feature extraction parameter corresponding to a charge-up phenomenon on a surface of the object according to a kind or a change of a section structure on the surface of the object.

In accordance with the present invention, an electron beam inspection method includes the steps of providing a surface of an object with pre-charge (i.e., blowing an electron shower) or discharge (i.e., blowing an ion shower), exposing the object to an electron beam, detecting in a sensor a physical change generated from the object, and conducting inspection or measurement of the object on the basis of a signal representing the detected physical change.

In accordance with the present invention, an electron beam inspection method includes the steps of providing a surface of an object with pre-charge (i.e., blowing an electron shower) or discharge (i.e., blowing an ion shower), exposing the object to an electron beam, detecting in a sensor a physical change generated from the object, and extracting a structural feature on the surface of the object from a signal representing the detected physical change.

In accordance with the present invention, an electron beam inspection apparatus includes an electron source, a beam deflector for deflecting an electron beam emitted from the electron source, an objective lens for focusing the electron beam emitted from the electron source upon an object, potential control means for controlling an acceleration voltage of the electron beam and an electric field in neighborhood of the object, a sensor for detecting a physical change generated from the object in response to the electric field controlled by the potential control means, upon exposure of the object to the electron beam with the acceleration voltage controlled by the potential control means, and image processing means for conducting inspection or measurement of the object on the basis of a signal representing a physical change detected from the sensor. In accordance with the present invention, an electron beam inspection apparatus includes an electron source, a beam deflector for deflecting an electron beam emitted from the electron source, an objective lens for focusing the electron beam emitted from the electron source upon an object, potential control means for controlling an acceleration voltage of the electron beam and an electric field in neighborhood of the object, a sensor for detecting a physical change generated from the object in response to the electric field controlled by the potential control means, upon exposure of the object to the electron beam with the acceleration voltage controlled by the potential control means, and display means for displaying a signal representing a physical change detected from the sensor.

In accordance with the present invention, an electron beam inspection apparatus includes an electron source, a beam deflector for deflecting an electron beam emitted from the electron source, an objective lens for focusing the electron beam emitted from the electron source upon an object, potential control means for controlling an acceleration voltage of the electron beam and an electric field in neighborhood of the object according to a kind or a change of a section structure on a surface of the object, a sensor for detecting a physical change generated from the object in response to the electric field controlled by the potential control means, upon exposure of the object to the electron beam with the acceleration voltage controlled by the potential control means, and image processing means for conducting inspection or measurement of the object on the basis of a signal representing a physical change detected from the sensor.

In accordance with the present invention, an electron beam inspection apparatus includes an electron source, a beam deflector for deflecting an electron beam emitted from the electron source, an objective lens for focusing the electron beam emitted from the electron source upon an object, potential control means for controlling an acceleration voltage of the electron beam and an electric field in neighborhood of the object according to a kind or a change of at least a material on a surface of the object, a sensor for detecting a physical change generated from the object in response to the electric field controlled by the potential control means, upon exposure of the object to the electron beam with the acceleration voltage controlled by the potential control means, and image processing means for conducting inspection or measurement of the object on the basis of a signal representing a physical change detected from the sensor.

In accordance with the present invention, an electron beam inspection apparatus includes an electron source, a beam deflector for deflecting an electron beam emitted from the electron source, an objective lens for focusing the electron beam emitted from the electron source upon an object, potential control means for controlling an acceleration voltage of the electron beam and an electric field in neighborhood of the object according to a kind or a change of a section structure in an electron beam irradiation area on the object, a sensor for detecting a physical change generated from the object in response to the electric field controlled by the potential control means, upon exposure of the object to the electron beam with the acceleration voltage controlled by the potential control means, and image processing means for conducting inspection or measurement of the object on the basis of a signal representing a physical change detected from the sensor.

In accordance with the present invention, an electron beam inspection apparatus includes an electron source, a beam deflector for deflecting an electron beam emitted from the electron source, an objective lens for focusing the electron beam emitted from the electron source upon an object, potential control means for effecting control so as to attain a proper acceleration voltage of the electron beam and a proper electric field in neighborhood of the object so as to correspond to a charge-up phenomenon on a surface of the object, a sensor for detecting a physical change generated from the object in response to the electric field controlled by the potential control means, upon exposure of the object to the electron beam with the acceleration voltage controlled by the potential control means, and image processing means for conducting inspection or measurement of the object on the basis of a signal representing a physical change detected from the sensor.

In accordance with the present invention, an electron beam inspection apparatus includes an electron source, a beam deflector for deflecting an electron beam emitted from the electron source, an objective lens for focusing the electron beam emitted from the electron source upon an object, potential control means for effecting control so as to attain a proper acceleration voltage of the electron beam and a proper electric field in neighborhood of the object so as to correspond to a charge-up phenomenon on a surface of the object according to a kind or a change of a section structure on the surface of the object, a sensor for detecting a physical change generated from the object in response to the electric field controlled by the potential control means, upon exposure of the object to the electron beam with the acceleration voltage controlled by the potential control means, and image processing means for conducting inspection or measurement of the object on the basis of a signal representing a physical change detected from the sensor.

In accordance with the present invention, an electron beam inspection apparatus includes an electron source, a beam deflector for deflecting an electron beam emitted from the electron source, an objective lens for focusing the electron beam emitted from the electron source upon an object, control means for controlling an acceleration voltage of an electron beam on a sample, an electric field on the sample, a beam current, a beam diameter, an image detection rate, image dimensions, pre-charge, discharge or a combination of them, a sensor for detecting a physical change generated from the object, upon exposure of the object to the electron beam, and image processing means for conducting inspection or measurement of the object on the basis of a signal representing a physical change detected from the sensor.

In accordance with the present invention, an electron beam inspection apparatus includes an electron source, a beam deflector for deflecting an electron beam emitted from the electron source, an objective lens for focusing the electron beam emitted from the electron source upon an object, control means for controlling an acceleration voltage of an electron beam on a sample, an electric field on the sample, a beam current, a beam diameter, an image detection rate, image dimensions, pre-charge, dis-charge, or a combination of them so as to correspond to a kind or a change of a section structure on a surface of the object, a sensor for detecting a physical change generated from the object, upon exposure of the object to the electron beam, and image processing means for conducting inspection or measurement of the object on the basis of a signal representing a physical change detected from the sensor.

In accordance with the present invention, an electron beam inspection apparatus includes an electron source, a beam deflector for deflecting an electron beam emitted from the electron source, an objective lens for focusing the electron beam emitted from the electron source upon an object, a sensor for detecting a physical change generated from the object, upon exposure of the object to the electron beam, inspection condition creation means for creating inspection conditions corresponding to a charge-up phenomenon on a surface of the object, image processing means for conducting inspection or measurement of the object on the basis of a signal representing a physical change detected from the sensor, under the inspection conditions created by the inspection condition creation means.

In accordance with the present invention, an electron beam inspection apparatus includes an electron source, a beam deflector for deflecting an electron beam emitted from the electron source, an objective lens for focusing the electron beam emitted from the electron source upon an object, a sensor for detecting a physical change generated from the object, upon exposure of the object to the electron beam, inspection condition creation means for creating inspection conditions corresponding to a charge-up phenomenon on a surface of the object according to a kind or a change of a section structure on the surface of the object, image processing means for conducting inspection or measurement of the object on the basis of a signal representing a physical change detected from the sensor, under the inspection conditions created by the inspection condition creation means.

In accordance with the present invention, an electron beam inspection apparatus includes an electron source, a beam deflector for deflecting an electron beam emitted from the electron source, an objective lens for focusing the electron beam emitted from the electron source upon an object, a sensor for detecting a physical change generated from the object, upon exposure of the object to the electron beam, feature extraction parameter creation means for creating a feature extraction parameter corresponding to a charge-up phenomenon on a surface of the object, and image processing means for extracting a structural feature of the object from a signal representing the physical change detected from the sensor, on the basis of a feature extraction parameter created by the feature extraction parameter creation means.

In accordance with the present invention, an electron beam inspection apparatus includes an electron source, a beam deflector for deflecting an electron beam emitted from the electron source, an objective lens for focusing the electron beam emitted from the electron source upon an object, means for providing a surface of the object with pre-charge or discharge, a sensor for detecting a physical change generated from the object, upon exposure of the object to the electron beam, and image processing means for conducting inspection or measurement of the object on the basis of a signal representing a physical change detected from the sensor under inspection conditions.

In accordance with the present invention, an electron beam inspection apparatus includes an electron source, a beam deflector for deflecting an electron beam emitted from the electron source, an objective lens for focusing the electron beam emitted from the electron source upon an object, means for providing a surface of the object with pre-charge or discharge, a sensor for detecting a physical change generated from the object, upon exposure of the object to the electron beam, and image processing means for extracting a structural feature of the object from a signal representing the physical change detected from the sensor, on the basis of a feature extraction parameter.

In accordance with the present invention, a semiconductor fabrication line includes a plurality of processing systems for processing substrates, a control system for controlling the plurality of processing systems, an electron beam inspection system for conducting inspection on the basis of an image signal, the image signal being obtained by exposing a substrate processed by a predetermined processing system to an electron beam, the processing systems being controlled by the control system on the basis of an inspection result obtained from the electron beam inspection system.

In accordance with the present invention, a semicondutor fabrication method includes the steps of controlling an acceleration voltage of an electron beam and an electric field in neighborhood of an object, exposing the object to the electron beam with the controlled acceleration voltage, detecting in a sensor a physical change generated from a semiconductor substrate in response to the controlled electric field, and conducting inspection or measurement of the semiconductor substrate on the basis of a signal representing the detected physical change and thereby fabricating the semiconductor substrate.

In accordance with the present invention, a semicondutor fabrication method includes the steps of controlling an acceleration voltage of an electron beam on a sample, an electric field on the sample, a beam current, a beam diameter, an image detection rate, image dimensions, pre-charge, discharge, or a combination of them, exposing a semiconductor substrate to the electron beam, detecting in a sensor a physical change generated from the semiconductor substrate, and conducting inspection or measurement of the semiconductor substrate on the basis of a signal representing the detected physical change and thereby fabricating the semiconductor substrate.

In accordance with the present invention, a semicondutor fabrication method includes the steps of exposing a semiconductor substrate to an electron beam, detecting in a sensor a physical change generated from the semiconductor substrate, and conducting inspection or measurement of the semiconductor substrate on the basis of a signal representing the detected physical change under inspection conditions corresponding to a charge-up phenomenon on a surface of the semiconductor substrate and thereby fabricating the semiconductor substrate.

In accordance with the present invention, a result of the inspection or measurement is analyzed and fed back to a predetermined process, in the semicondutor fabrication method.

In accordance with the present invention, an electron beam inspection method includes the steps of exposing a sample having a pattern formed on a surface thereof to an electron beam, controlling an acceleration voltage of the electron beam and an electric field in neighborhood of the sample according to the material in an area on the sample exposed to the electron beam, detecting secondary electrons or back-scattered electrons generated from the sample, and thereby inspecting the pattern on the sample.

In accordance with the present invention, the acceleration voltage of the electron beam is controlled on the basis of a difference between the secondary electron yield ratio of the pattern and the secondary electron yield ratio of portions other than the pattern, in the electron beam inspection method. In accordance with the present invention, the electric field in the neighborhood of the sample surface is controlled on the basis of the secondary electron yield ratio of the pattern, in the electron beam inspection method.

In accordance with the present invention, an electron beam inspection method includes the steps of exposing a sample having a pattern formed on a surface thereof to an electron beam, controlling an acceleration voltage of the electron beam and an electric field in neighborhood of the sample according to the material in an area on the sample exposed to the electron beam, counteracting charges stored on the sample surface, detecting secondary electrons or back-scattered electrons generated from the sample, and displaying an image of the detected secondary electrons or back-scattered electrons on a screen, and thereby inspecting the pattern on the sample.

As heretofore described, the present invention makes it possible to reduce the charge-up phenomenon caused when an object is exposed to an electron beam, obtain a high-contrast signal representing a physical property by using secondary electrons or back-scattered electrons obtained from the object, and inspect a minute deffect at high speed and with high reliability.

Furthermore, the present invention makes it possible to adapt the inspection condition to the charge-up phenomenon caused when an object is exposed to an electron beam, conduct inspection or measurement of the basis of an image signal representing a physical property by using secondary electrons or back-scattered electrons obtained from the object, and inspect a minute deffect at high speed and with high reliability. Furthermore, the present invention makes it possible to inspect minute resist patterns and insulator patterns which are apt to be charged, with high reliability.

Furthermore, the present invention makes it possible to inspect minute pattern defects on a semiconductor substrate such as a semiconductor wafer with high reliability and improve the yield.

Furthermore, the present invention makes it possible to inspect minute pattern defects on a semiconductor substrate such as a semiconductor wafer with high reliability and consequently makes it possible to inspect minute pattern defects on a wafer having minute pattern line widths in a fabrication line.

BRIEF DESCRIPTION OF THE DRAWINGS

FIG. 7 is a schematic sectional view showing how an object having a surface section structure formed by a material A (upper layer pattern) and a material B (lower layer pattern) according to the present invention is exposed to an electron beam and how the material A (upper layer pattern) is charged up so as to become negative;

FIGS. 8A through 8C are diagrams showing a contrast fall appearing in the detected image as the influence of charge-up when the material A (upper layer pattern) is charged up so as to become negative and showing mask signals;

FIGS. 14A through 14C are diagrams illustrating various sequences in a system for detecting a pattern on an object according to the present invention;

DESCRIPTION OF THE PREFERRED EMBODIMENTS

An embodiment of a pattern inspection method for inspecting pattern dimensions and defects on an object such as a semiconductor wafer by using an electron beam and of a fabrication method of a semiconductor wafer according to the present invention will now be described by referring to drawing.

The case where a semiconductor wafer is used as an object will be described. The same holds true also for other objects such as a photomask, thin film multilayer substrate, printed circuit board or TFT substrate.

Figure 1:
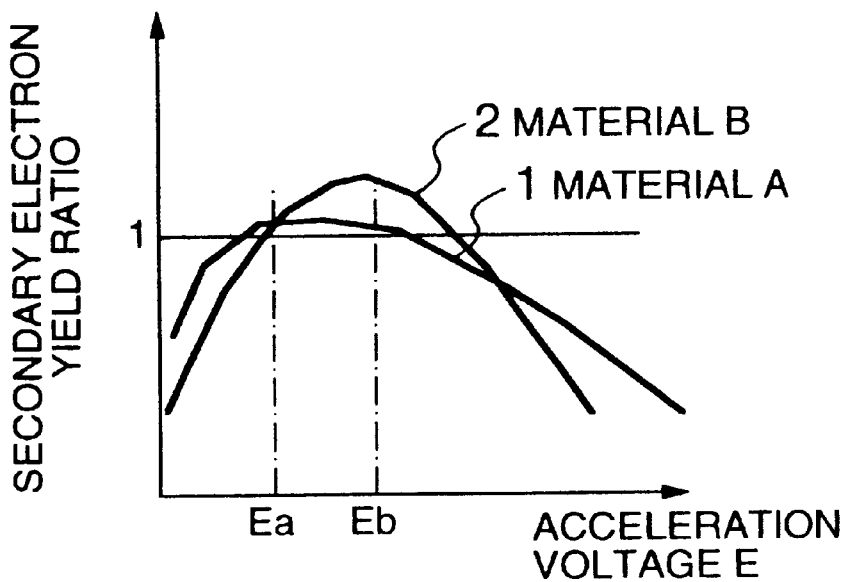
FIG. 1 is a diagram showing the relations between acceleration voltage E and secondary electron yield ratio η for a plurality of materials according to the present invention.
Figures 2A, 2B:
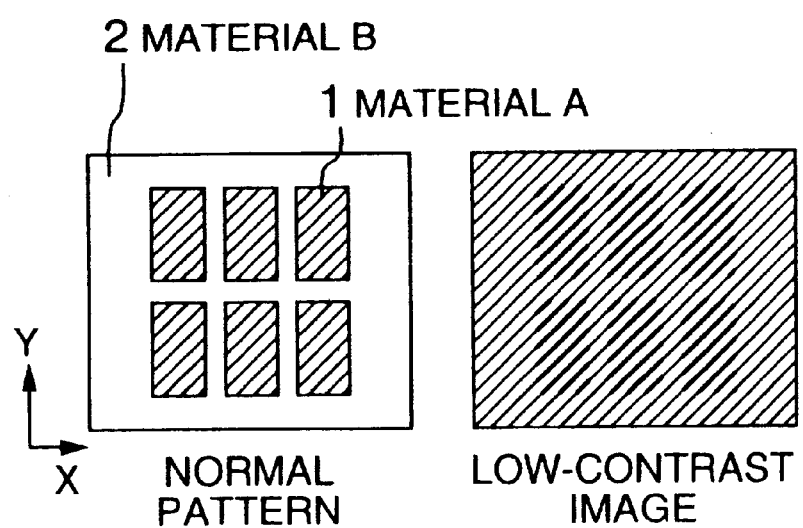
FIGS. 2A and 2B are diagrams showing an example of a detected image in the case where the secondary electron yield ratios η are made close to each other for a plurality of materials by making the acceleration voltage nearly equal to Ea.

By using an electron beam according to the present invention, a pattern on an object such as a semiconductor wafer is detected. An embodiment in which the pattern of the object is formed by a material A and a material B as shown in a sectional view of FIG. 3 will first be described. This object forms a solid section structure having a layer made of the material A and an upper layer made of the material B. In the case where an object thus forming a solid section structure having different materials is exposed to an electron beam, there is sometimes little contrast at a specific acceleration voltage. This will now be described by referring to FIG. 1. FIG. 1 shows the relation between the acceleration voltage E and the secondary electron yield ratio η in the case of the material A1 and the material B2. In the case where the acceleration voltage Eb is used, the secondary electron yield ratio of the material A1 is largely different from that of the material B2 as evident from FIG. 1. Therefore, a secondary electron image obtained from the material A1 and the material B2 has sufficient contrast as shown in FIG. 2A. Inspection including measurement as well (inspection of the dimension or defect) is thus possible. On the contrary, if a specific acceleration voltage Ea is used, then the secondary electron yield ratio of the material A1 is equal to that of the material B2, and there is little contrast in the secondary electron image obtained from the material A1 and the material B2. In this case, therefore, a resultant image has little contrast, and inspection including measurement as well (inspection of the dimension or defect) becomes thus impossible. The specific acceleration voltage Ea differs depending upon the material. According to the material of the object, therefore, the suitable acceleration voltage differs.

Figure 3:
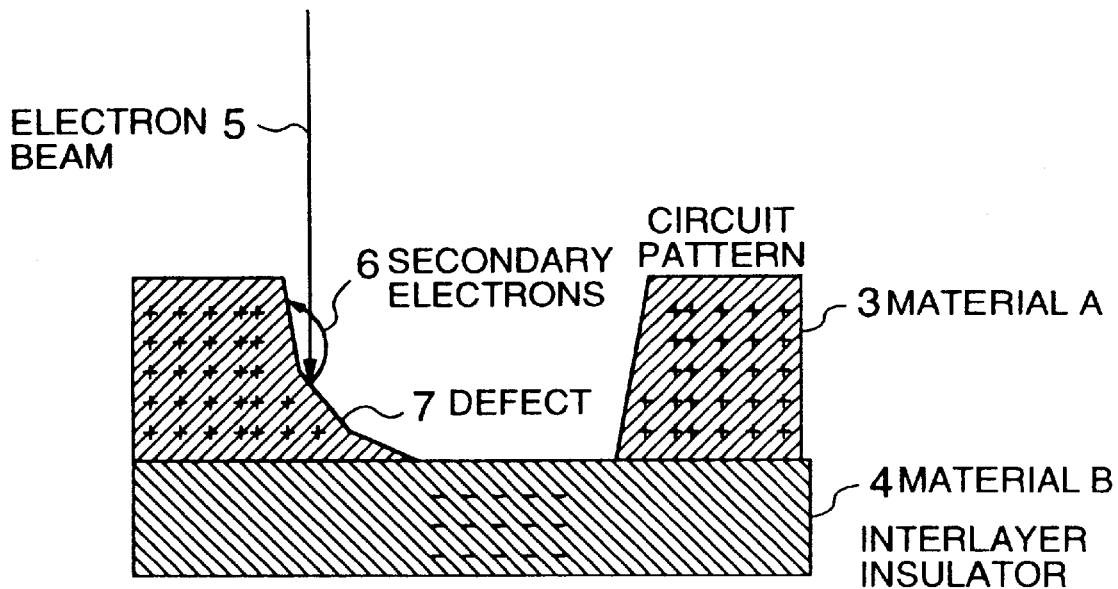
FIG. 3 is a schematic sectional view showing how an object having a surface section structure formed by a material A (upper layer pattern) and a material B (lower layer pattern) according to the present invention is exposed to an electron beam and the material A (upper layer pattern) is charged up so as to become positive.
Figure 4A:
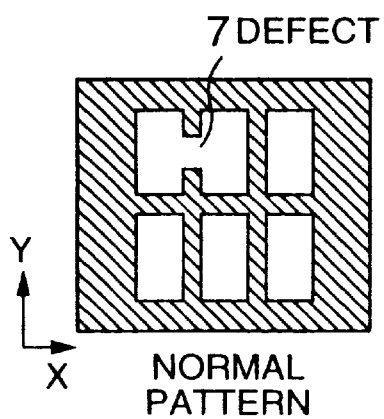
FIGS. 4A through 4C are diagrams illustrating defect shrinkage caused in the detected image when the material A (upper layer pattern) is charged up so as to become positive as shown in FIG. 3.
Figure 4B:
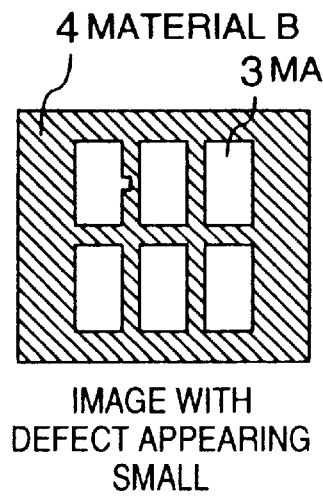
Figure 4C:
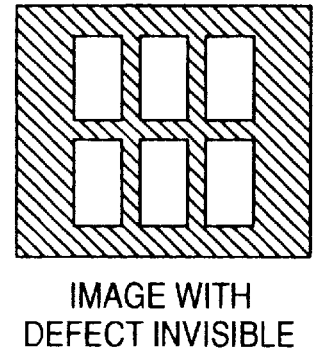
Figure 5A:
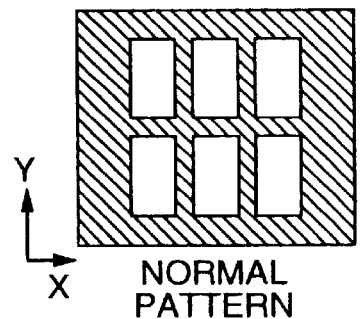
FIGS. 5A and 5B are diagrams illustrating shrinkage of the upper layer pattern caused in the detected image when the material A (upper layer pattern) is charged up so as to become positive.
Figure 5B:
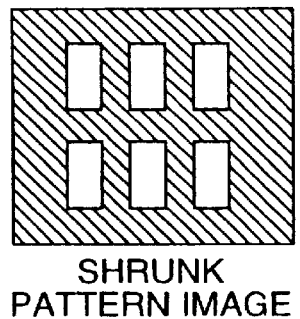

By using an electron beam according to the present invention, a pattern on an object such as a semiconductor wafer is detected. An embodiment in which the pattern of the object is formed by a material A3 and a material B4 will now be described by referring to FIG. 3, FIGS. 4A, 4B and 4C, FIG. 5, and FIGS. 6A, 6B, 6C, 6D and 6E. As shown in FIG. 3, an object having a solid section structure and including an upper layer made of the material A3 (such as a circuit pattern which is conductive) and a lower layer made of the material B4 (such as an interlayer insulator which is dielectric) is exposed to an electron beam. It is now assumed that such a condition that the material B4 is charged up so as to be negative is then satisfied. In other words, the secondary electron yield ratio η is unity or less (which means that the irradiated electron beam is absorbed and consequently the yielded secondary electrons are significantly reduced as compared with the irradiation electron beam). In addition, it is also assumed that such a condition that the material A3 is charged up so as to be positive is satisfied. In other words, the secondary electron yield ratio η is unity or more (which means that secondary electrons nearly equivalent to the irradiation electron beam are yielded). In the case where the degree of charge-up is low, a defect 7 of the material A3 appears bright in detection, to say nothing of the material A3 as shown in FIG. 4A. The material B4 appears dark in detection, and a defect 7 of the material A3 forced out into the portion which should originally be the material B4 also appears bright in detection. In the case where the charge-up is intense, however, there is positive charge-up in the material A3 located in the upper layer. Therefore, secondary electrons 6 supplied from the defect 7 of the material A3 located in the lower layer are drawn toward the material A3 charged up so as to become positive and are not detected by a secondary electron detector 16 (11) which will be described later by referring to FIGS. 13, 14A through 14C, and 17. As shown in FIGS. 4B or 4C, therefore, the defect appears small in detection or the defect cannot be detected at all. Since information of the inclined portion of the material B4 is lost in the same way, the pattern dimension which should be detected as shown in FIG. 5A appears small in detection as shown in FIG. 5B.

Figure 6A:
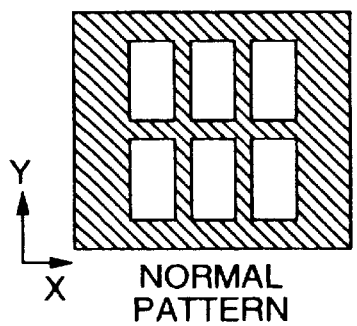
FIGS. 6A through 6E are diagrams showing that the influence of charge-up exerted on the detected image when the material A (upper layer pattern) is charged up so as to become positive appears in relation to the high-speed scanning direction of the electron beam and showing mask signals.
Figure 6B:
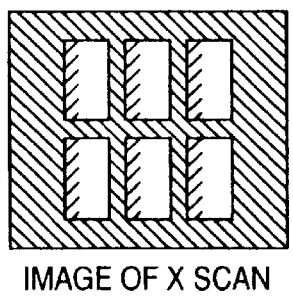

Furthermore, this phenomenon differs depending upon the speed of ease of the charge-up of the object, i.e., the speed of diffusion of electric charge charged up so as to become positive or negative. If the ease of charge-up is fast, the phenomemon is complicated and the scan direction dependency of the electron beam becomes large. Depending upon whether the scan direction is X or Y, there occurs a difference in lost information. As a result, images as shown in FIGS. 6A and 6B are obtained. When a scan is conducted in the X direction, an influence tends to appear in the neighborhood of the pattern edge in the X direction. When a scan is conducted in the Y direction, an influence tends to appear in the neighborhood of the pattern edge in the Y direction. The diffusion differs depending upon the conductance of the lower layer pattern (material B). If the conductance is large, then the diffusion is extremely fast and the ease of the charge-up is fast.

By using an electron beam according to the present invention, a pattern on an object such as a semiconductor wafer is detected. A third embodiment in which the pattern of the object is formed by a material A8 and a material B9 will now be described by referring to FIGS. 7, 8A, 8B and 8C. As shown in FIG. 7, an object having a solid section structure and including a lower layer made of the material B8 and an upper layer made of the material B4 is exposed to an electron beam 5. It is now assumed that such a condition that the material B9 is charged up so as to be positive is then satisfied. In other words, the secondary electron yield ratio η is unity or more. In addition, it is also assumed that such a condition that the material A8 is charged up so as to be negative is satisfied. In other words, the secondary electron yield ratio η is unity or less. In the case where the degree of charge-up is low, the material A8 appears dark in detection as shown in FIG. 8A. The material B9 appears bright in detection. In the case where the charge-up is intense, however, an electric field is formed under the influence of charge-up. The electric field formed in the neighborhood is illustrated. An equipotential line 73 of 0 V and a negative equipotential line 72 are formed. When the material A8 is exposed to the electron beam 5 and consequently secondary electrons 71 are generated, the secondary electrons 71 are put back by a repulsive force from the negative electric field. Therefore, the secondary electrons 71 cannot arrive at a secondary electron detector 16 (11), and consequently information concerning the lower layer is lost. In a portion having a dense pattern density as shown in FIG. 8B, therefore, a portion which should appear bright in detection appears dark and a suspected pattern occurs on a boundary between different pattern densities.

Figure 9A:
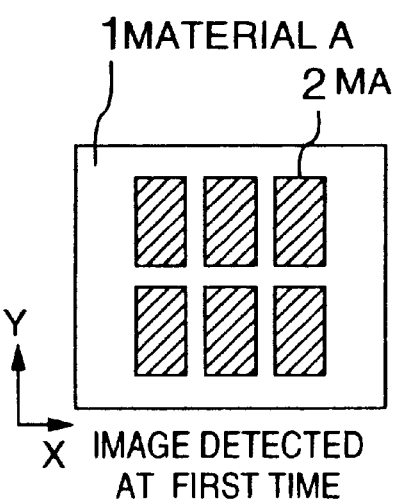
FIGS. 9A and 9B are diagrams illustrating a change of detected image caused according to the number of scans when the material A (upper layer pattern) is charged up so as to become negative.
Figure 9B:
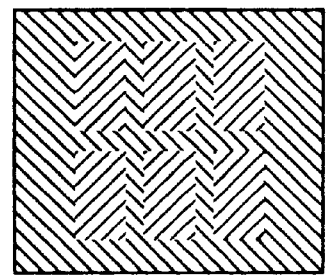

If charge-up occurs, the secondary electron yield ratio $\eta$ is changed in both cases by its own charge-up. As shown in FIGS. 9A and 9B, therefore, an image detected after detection of a plurality of times is changed from an image detected at the first time.

In accordance with the present invention, therefore, charge-up is first prevented from occurring as far as possible at least in a pattern located in the upper layer (made of the material A) in an object 20. In other words, the degree of charge-up is lowered. In addition, from the pattern (material A) and a minute spacing of this pattern (material B), a proper contrast value $\rho$ is derived (so as to be high as far as possible). The condition of inspection including the measurement is made proper (is corrected) so as to detect images under such a condition. This will now be described in detail. In the object 20, charge-up is prevented from occurring as far as possible at least in the pattern located in the upper layer (the material A or B) having a characteristic of second electron yield ratio $\eta$ with respect to an acceleration voltage E for the electron beam used to irradiate the materials A and B as shown in FIG. 1. (The secondary electron yield ratio $\eta$ from the pattern (material A or B) located in the upper layer is set to a value belonging to a small permitted value range around unity.) In addition, it is attempted to achieve a proper value of contrast $\rho$. (The secondary electron yield ratio $\eta$ from the material B or A located in the lower layer is set to a value belonging to a predetermined range such as a range of 0.7 to 1.2 so as to make the difference from the secondary electron yield ratio of the material A or B located in the upper layer the greatest.) Instead of an image signal significantly influenced by the charge-up as shown in FIG. 8B, therefore, an image signal reduced in influence of the charge-up and having a proper contrast value $\rho$ as shown in FIGS. 4A, 5A or 8A can be detected by the sensor 11. For preventing charge-up from occurring at least in the pattern located in the upper layer (material A or B) of the object 20 as far as possible, there can be used a method of reducing the quantity of the electron beam stored on the object 20 or a method of exposing the object to an electron shower or an ion shower for counteraction.

The method of reducing the quantity of the electron beam stored on the object 20 can be implemented by providing proper acceleration voltage ($E_0-E_2$) for accelerating the electron beam emitted from an electron source 14 is provided between the object 20 or voltage providing means 19 such as a grid passing the electron beam disposed over the object 20 and the electron source 14 (which will be described later by referring to FIG. 13 and succeeding drawing) and by providing a proper potential difference ($E_0-E_1$) proportionate to an electric field $\alpha$ on the object between the voltage providing means 19 such as a grid and the object 20. However, the phenomenon of charge-up in the pattern located in the upper layer changes if the constituent material (material) and section structure of the pattern located in the upper layer are changed. Therefore, it is necessary to set especially the acceleration voltage E of the electron beam used to irradiate the object and the electric field $\alpha$ on the object at proper values with due regard to the constituent material (material) and the section structure of the pattern located in the upper layer (such as the relation between the constituent material [material] of the upper layer and the constituent material [material] of the lower layer, and the shape of the pattern [including the pattern width and pattern density] and thickness of the pattern). Because the charge-up phenomenon changes and consequently the second electron yield ratio $\eta$ changes according to the constituent material (material) and the section structure of the pattern located in the upper layer (such as the shape of the pattern [including the pattern width and pattern density] and thickness of the pattern and the relation with respect to the constituent material [material] of the lower layer). In FIG. 1, the secondary electron yield ratio $\eta$ is shown as a function of the acceleration voltage E for different materials.

Figure 6C:
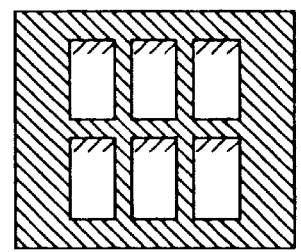

Furthermore, since the charge-up ease phenomenon (diffusion phenomenon of electric charge charged up) occurs in the pattern especially located in the upper layer, there occurs a difference in the image signal detected by the sensor 11 according to whether the scan direction of the electron beam is the X direction or Y direction as shown in FIGS. 6B and 6C. Therefore, it is necessary to set especially the acceleration voltage E of the electron beam used to irradiate the object and the electric field $\alpha$ on the object at proper values so as to reduce as far as possible the difference between an image signal detected by the sensor 11 when the scan direction of the electron beam with respect to the object 20 is the X direction and that when the scan direction of the electron beam is the Y direction.

Furthermore, in order to inspect the dimension or faults for the pattern located in the upper layer, it is necessary to set especially the acceleration voltage E of the electron beam used to irradiate the object and the electric field $\alpha$ on the object at proper values so that the pattern located in the upper layer may be detected with a proper contrast value $\rho$ as the image signal detected by the sensor 11.

By the way, the potential difference ($E_0-E_2$) represents a potential difference between the electron source 14 and the object 20 as described later. The potential difference ($E_0-E_2$) is the acceleration voltage E shown in FIG. 1. By controlling this potential difference ($E_0-E_2$), i.e., the acceleration voltage E, it is possible to change the charge-up phenomenon especially for the pattern located in the upper layer (the material A or B), and consequently change the secondary electron yield ratio $\eta$. In the case where the electric field $\alpha$ is positive, i.e., the secondary electrons are decelerated, secondary electrons become difficult to be yielded, resulting in a reduced secondary electron yield ratio. On the other hand, in the case where the electric field $\alpha$ is negative, i.e., the secondary electrons are accelerated, secondary electrons become easy to be yielded, resulting in an increased secondary electron yield ratio $\eta$.

Furthermore, the charge-up phenomenon can be changed and the detected image signal can be made proper also by controlling the beam current on the object, beam diameter, image detection rate (which is the clock frequency for reading image signals and which changes the beam current density), or the image dimension (which is changed by changing the scan rate of the electron beam and consequently the beam current density).

As heretofore described, according to the material and the section structure of the pattern of the object (such as the shape of the pattern [including the pattern width and pattern density] and thickness of the pattern and the relation with respect to the constituent material [material] of the lower layer), two parameters, for example, (the acceleration voltage E of the electron beam used to irradiate the object and the electric field α on the object) are controlled according to a predetermined relation. Thereby, the secondary electron yield ratio η especially from the pattern located in the upper layer is set in a range (approximately unity) permissible with respect to unity. Thereby, the charge-up occurring in the pattern located in the upper layer is reduced to become less than a predetermined value so as to hardly occur. By putting the secondary electron yield ratio η from the material located in the lower layer into a predetermined range (such as the range of 0.7 to 1.2), the charge-up is reduced as far as possible also for the material located in the lower layer. In addition, by making the difference in secondary electron yield ratio η between the pattern located in the upper layer and the pattern spacing which is not located in the upper layer large as far as possible, the contrast ρ can be made proper. Under such a condition that the charge-up is not caused especially for the pattern located in the upper layer, therefore, an image having a sufficient contrast value can be detected by the sensor 11 and inspection of the dimension and defects in the pattern having a finer pattern width can be realized with high reliability. In other words, with due regard to various factors according to the material and the section structure of the pattern of the object (such as the shape of the pattern [including the pattern width and pattern density] and thickness of the pattern and the relation with respect to the constituent material [material] of the lower layer), inspection of the dimension and defects in the fine pattern on the semiconductor wafer having a finer pattern width can be realized with high reliability. Even in a chip formed on a semiconductor wafer, the material and the section structure of the pattern of the object (such as the shape of the pattern [including the pattern width and pattern density] and thickness of the pattern and the relation with respect to the constituent material [material] of the lower layer) change in some cases. Even in a chip formed on a semiconductor wafer, therefore, it becomes necessary to control the two parameters (the acceleration voltage E of the electron beam used to irradiate the object and the electric field α on the object) according to a predetermined relation. If the material and the section structure of the surface pattern to be inspected as to the dimension and defects change in the object, it is a matter of course that it becomes necessary to control the two parameters (the acceleration voltage E of the electron beam used to irradiate the object and the electric field α on the object) according to a predetermined relation. In any case, it will suffice that the condition of two parameters (the acceleration voltage E of the electron beam used to irradiate the object and the electric field α on the object) suitable for the material and the section structure of the surface pattern can be set until the time immediately before inspecting the surface pattern of the object.

Even if the acceleration voltage E of the electron beam used to irradiate the object and the electric field α on the object are made proper, it is impossible to almost get rid of the charge-up phenomenon and the charge-up ease phenomenon (diffusion phenomenon of the electric charge charged up) especially for the pattern located in the upper layer. In the case where a defect inspection, for example, is to be conducted for the pattern located in the upper layer on the basis of the image signal detected by the sensor 11, therefore, a parameter for extracting a structural feature of defects and a defect judgment standard (inspection standard) for comparison are determined with due regard to the charge-up phenomenon and the charge-up ease phenomenon (diffusion phenomenon of the electric charge charged up) for the pattern located in the upper layer. By doing so, false detection based upon the charge-up phenomenon and the charge-up ease phenomenon for the pattern located in the upper layer can be eliminated and the inspection of the dimension and defects in a fine pattern on a semiconductor wafer having a finer pattern width can be realized with high reliability. If the material and the section shape of the pattern of the object (including the pattern width and pattern density) are changed, the charge-up phenomenon and the charge-up ease phenomenon (diffusion phenomenon of the electric charge charged up) for the pattern located in the upper layer also change. Therefore, the parameter for extracting the structural feature of defects and the defect judgment standard for comparison may be chosen according to the material and the section shape of the pattern of the object (including the pattern width and pattern density). Alternatively, the charge-up phenomenon and the charge-up ease phenomenon (diffusion phenomenon of the electric charge charged up) for the pattern located in the upper layer may be detected and the parameter for extracting the structural feature of defects and the defect judgment standard for comparison may be chosen according to the detected charge-up phenomenon and the charge-up ease phenomenon (diffusion phenomenon of the electric charge charged up) for the pattern located in the upper layer.

A first embodiment of a system for detecting a pattern on an object such as a semiconductor wafer by using an electron beam according to the present invention will now be described by referring to FIG. 13. The present system includes an electron source 14 having a potential $E_2$ with respect to the ground and generating an electron beam, a beam deflector 15 for effecting a scan with the electron beam and conducting imaging, an objective lens 18 for focusing the electron beam upon an object 20, and a potential providing device 19. The potential providing device 19 is disposed between the objective lens 18 and the object 20 such as a semiconductor wafer. The potential providing device 19 has a potential $E_1$ with respect to the grid and provides a grid or the like with a potential. The present system further includes a wafer holder 21. The object 20 is mounted on the wafer holder 21. The wafer holder 21 is capable of holding the object 20 at a potential $E_0$ with respect to the ground, and has an X-Y stage. The present system further includes a sensor 11 for detecting a physical change of secondary electrons generated by the object 20 and back-scattered electrons, a height sensor 13 for detecting the height of the object 20, and a potential controller 23 for controlling the potential values $E_0$, $E_1$ and $E_2$ of respective portions which in turn determine the acceleration voltage of the electron beam for the object 20. The present system further includes a focus controller 22 for controlling the objective lens 18 on the basis of the height of the object 20 detected by the height sensor 13 to effect focus control, an A/D converter 24 for converting a waveform or image signal representing the physical property of the object detected by the sensor 11 to a digital signal, and an image processor 25 for conducting image processing on the digital signal obtained from the A/D converter 24 and conducting inspection including the dimension measurement of a pattern located on the object. The present system further includes an inspection condition corrector 27. On the basis of the digital signal obtained from the A/D converter 24 so as to correspond to a process index and an object index representing the surface section structure of the object 20, the inspection condition corrector 27 corrects inspection conditions (such as conditions of the above described two parameters [the acceleration voltage E of the electron beam for the object which is given as a potential difference ($E_0$-$E_2$), and the electric field α on the object which is given by a nearly proportionate relation as a potential difference ($E_0$-$E_1$)] or the charge-up phenomenon to the pattern located in the upper layer and charge-up ease phenomenon [diffusion phenomenon of the electric charge charged up]). The present system further includes an inspection condition setter 28. By specifying a process index and an object index representing the surface section structure of the object 20, the inspection condition setter 28 stores the inspection conditions (such as conditions of the above described two parameters [the acceleration voltage E of the electron beam for the object which is given as a potential difference ($E_0$-$E_2$), and the electric field α on the object which is given by a nearly proportionate relation as a potential difference ($E_0$-$E_1$)] or the charge-up phenomenon to the pattern located in the upper layer and charge-up ease phenomenon [diffusion phenomenon of the electric charge charged up]) for each group of objects (for every objects having the same surface structure). The inspection condition setter 28 thus sets inspection conditions. The present system further includes a deflection controller 47 for controlling the beam deflector 15, a stage controller 50 for controlling the wafer holder 21, and a whole controller 26 for controlling the whole of them.

As the sequence of this system, three ways as shown in FIGS. 14A, 14B and 14C can be considered.

In a first scheme, the inspection conditions (such as conditions of the above described two parameters [the acceleration voltage E of the electron beam for the object which is given as a potential difference ($E_0$-$E_2$), and the electric field α on the object which is given by a nearly proportionate relation as a potential difference ($E_0$-$E_1$)]) are set at the time of inspection as shown in FIG. 14A. At step 31a, the object 20 is loaded. At step 32a, the object 20 is aligned. From the relation of the charge-up phenomenon based on the secondary electron yield ratio η which is in turn extracted on the basis of the waveform or image signal representing the physical property of the object 20 detected by the sensor 11, and the charge-up ease phenomenon based upon a signal change detected by a plurality of scans of the electron beam, an operator then judges and the inspection condition corrector 27 corrects and stores the inspection conditions at step 33a. With respect to the corrected inspection conditions stored in the inspection condition corrector 27, the inspection condition setter 28 stores and sets desired inspection conditions at step 34a. At step 35a, the whole controller 26 controls potential values $E_0$, $E_1$ and $E_2$ of respective portions by using the potential controller 23 on the basis of the desired inspection conditions preset in the inspection condition setter 28, focuses an electron beam yielded from the electron source 14 upon the object 20 by using the objective lens 18, causes a scan by using the beam deflector 15, detects the physical change of the secondary electrons and back-scattered electrons generated by the object 20 by using the sensor 11, and obtains the waveform or image signal representing the detected physical property of the object. On the basis of this signal, an inspection of the dimension or defects is conducted in the image processor 25. At step 36a, the object 20 is unloaded.

In a second scheme, the inspection conditions (such as the above described two parameters [the acceleration voltage E of the electron beam for the object which is given as a potential difference ($E_0$-$E_2$), and the electric field α on the object which is given by a nearly proportionate relation as a potential difference ($E_0$-$E_1$)]) are set before inspection as shown in FIG. 14B. At step 31b, objects having different surface structures are loaded beforehand for each group of objects such as each lot (i.e., for every objects having the same surface structure). At step 32b, the object is aligned. From the relation of the charge-up phenomenon based on the secondary electron yield ratio η which is extracted on the basis of the waveform or image signal representing the physical property of the object 20 detected by the sensor 11, and the charge-up ease phenomenon based upon a signal change detected by a plurality of scans of the electron beam, the inspection condition corrector 27 corrects and stores the inspection conditions at step 33b. At step 36b, each object 20 is unloaded. At step 31c, an object 20 to be subsequently inspected is then loaded. At step 32c, the object is aligned. From the corrected inspection conditions for each object having the same surface structure stored in the inspection condition corrector 27, the inspection condition setter 28 selects, stores and sets desired inspection conditions corresponding to the object to be actually inspected at step 34c. At step 35c, the whole controller 26 controls potential values $E_0$, $E_1$ and $E_2$ of respective portions by using the potential controller 23 on the basis of the desired inspection conditions preset in the inspection condition setter 28, focuses an electron beam yielded from the electron source 14 upon the object 20 by using the objective lens 18, causes a scan by using the beam deflector 15, detects the physical change of the secondary electrons and back-scattered electrons generated by the object 20 by using the sensor 11, and obtains the waveform or image signal representing the detected physical property of the object. On the basis of this signal, an inspection of the dimension or defects is conducted in the image processor 25. At step 36c, the object 20 is unloaded.

A third scheme is shown in FIG. 14C. On the basis of the relation of the charge-up phenomenon and the charge-up ease phenomenon based upon the secondary electron yield ratio η which can be theoretically or empirically calculated from the information of the object, the inspection conditions (such as conditions of the above described two parameters [the acceleration voltage E of the electron beam for the object which is given as a potential difference ($E_0$-$E_2$), and the electric field α on the object which is given by a nearly proportionate relation as a potential difference ($E_0$-$E_1$)]) are stored and set in the inspection condition setter 28 before inspection at step 37d. At step 31d, an object 20 to be subsequently inspected is then loaded. At step 32d, the object 20 is aligned. From the inspection conditions stored and set beforehand in the inspection condition setter 28, desired inspection conditions are stored and set at step 34d. At step 35d, the whole controller 26 controls potential values $E_0$, $E_1$ and $E_2$ of respective portions by using the potential controller 23 on the basis of the preset desired inspection conditions, focuses an electron beam yielded from the electron source 14 upon the object 20 by using the objective lens 18, causes a scan by using the beam deflector 15, detects the physical change of the secondary electrons and back-scattered electrons generated by the object 20 by using the sensor 11, and obtains the waveform or image signal representing the detected physical property of the object. On the basis of this signal, an inspection of the dimension or defects is conducted in the image processor 25. At step 36d, the object 20 is unloaded. The inspection condition setting into the inspection condition setter 28 at step 37d may be conducted even after the loading so long as it is conducted before the inspection.

Besides the above described two parameters, the beam current on the object, beam diameter, image detection rate (which is the clock frequency for reading image signals and which changes the beam current density), or the image dimension (which is changed by changing the scan rate of the electron beam and consequently the beam current density) can be considered as the inspection conditions.

Figure 10:
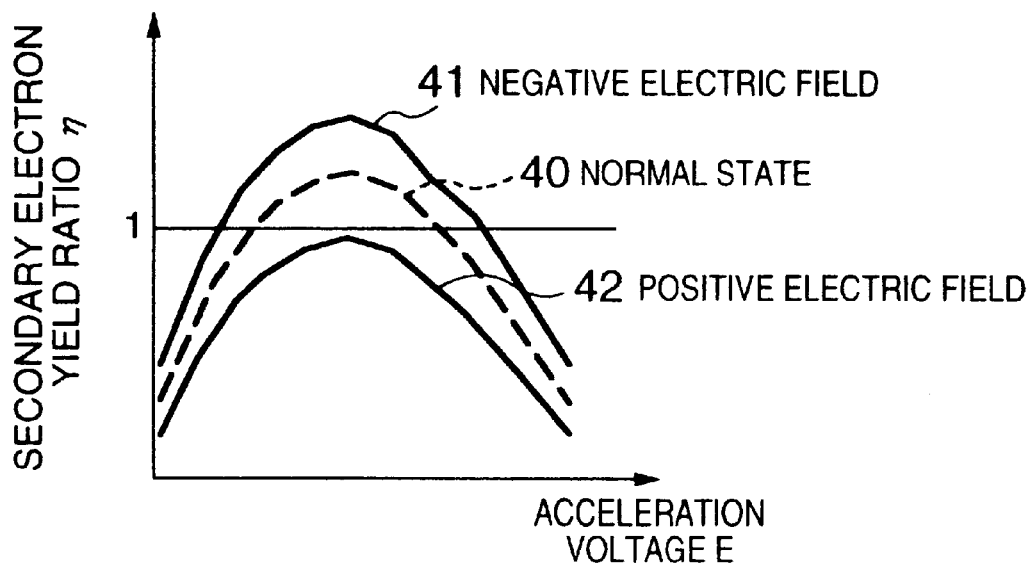
FIG. 10 is a diagram showing a change of the secondary electron yield ratio η in the case where a positive or negative electric field α is given to a certain material according to the present invention.

Correction of the inspection conditions forming components of these systems, setting the inspection conditions based on information from the object, and setting the corrected inspection conditions will now be described. In other words, it suffices that the relations shown in FIGS. 1 and 10 are derived beforehand. If in the section structure (such as the materials A and B) of the object 20 the dependence of the secondary electron yield ratio η upon the acceleration voltage ($E=E_0-E_2$) between the electron source 14 and the object 20 and the potential difference ($E_0-E_1$) proportionate to the electric field α on the object is known, i.e., these relation tables are created, then a proper contrast value ρ (given by a difference between the secondary electron yield ratio η from the upper layer pattern and the secondary electron yield ratio η from the lower layer pattern) indicated by a difference in brightness of image signal between the upper layer pattern and the lower layer pattern can be chosen so as to prevent the charge-up from occurring with respect to the upper layer pattern within a certain permissible range (i.e., so as to attain a small permissible value range of the secondary electron yield ratio η from the upper layer pattern around unity) and so as to suppress the charge-up as far as possible for the lower layer pattern as well (i.e., so as to attain a large permissible value range [such as a range of 0.7 to 1.2] of the secondary electron yield ratio η from the lower layer pattern around unity).

Figure 11:
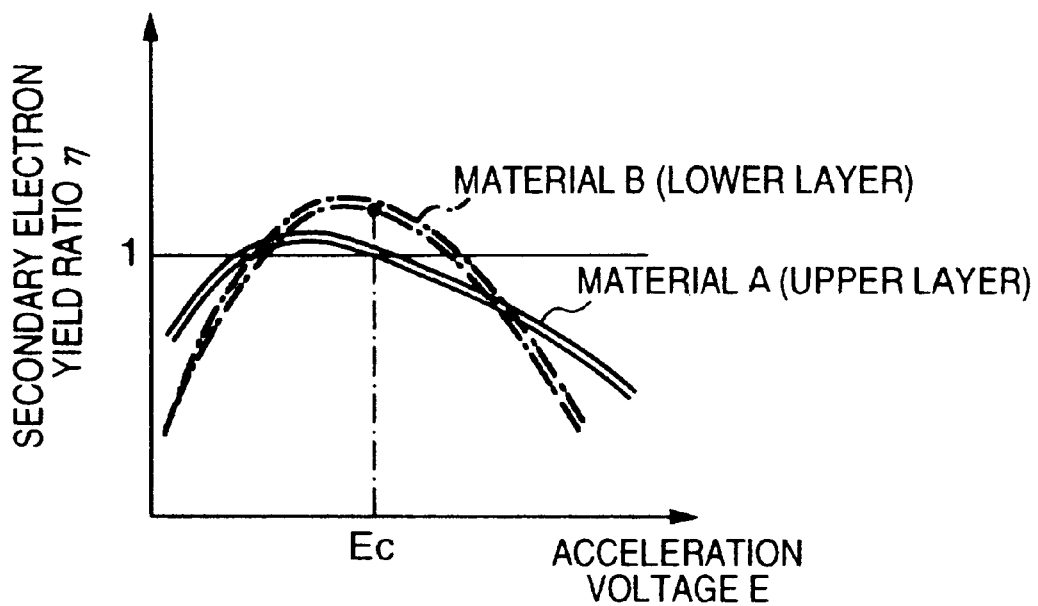
FIG. 11 is a diagram illustrating an embodiment of setting a proper acceleration voltage E and a proper electric field α so as to reduce occurrence of charge-up in a surface section structure of an object having an upper layer pattern made of the material A and a lower layer pattern made of the material B according to the present invention.

In other words, a proper acceleration voltage Ec is chosen as shown in FIG. 11 so as to make large the difference (contrast ρ) between the secondary electron yield ratio η (illustrated by solid lines) from the upper layer pattern (material A) and the secondary electron yield ratio η (illustrated by broken lines) from the lower layer pattern (material B). Thereafter, a potential difference ($E_0-E_1$) proportionate to the electric field α on the object is chosen so as to put the secondary electron yield ratio η from the upper layer pattern (material A) into a small permissible value range around unity. If at that time the secondary electron yield ratio η from the lower layer pattern (material B) does not come in a large permissible value range around unity, then proper inspection conditions can be chosen by finely adjusting the acceleration voltage Ec.

Figure 12:
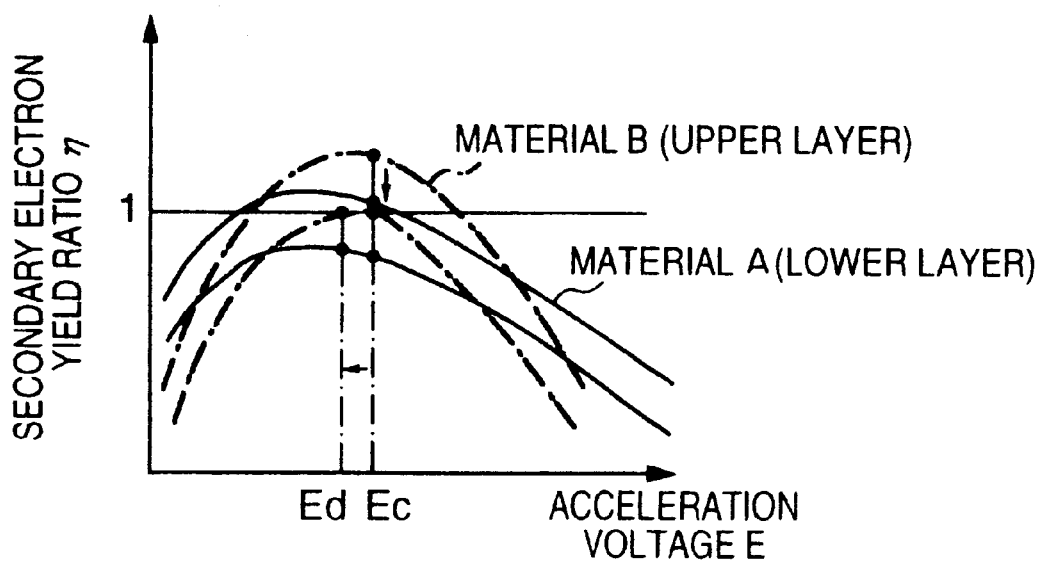
FIG. 12 is a diagram illustrating an embodiment of setting a proper acceleration voltage E and a proper electric field α so as to reduce occurrence of charge-up in a surface section structure of an object having an upper layer pattern made of the material B and a lower layer pattern made of the material A according to the present invention.

Furthermore, a proper acceleration voltage Ec is chosen as shown in FIG. 12 so as to make large the difference (contrast ρ) between the secondary electron yield ratio η (illustrated by broken lines) from the upper layer pattern (material B) and the secondary electron yield ratio η (illustrated by solid lines) from the lower layer pattern (material A). Thereafter, a potential difference ($E_0-E_1$) proportionate to the electric field α on the object is chosen so as to put the secondary electron yield ratio η from the upper layer pattern (material A) into a small permissible value range around unity. If at that time the secondary electron yield ratio η from the lower layer pattern (material A) does not come in a large permissible value range around unity, then proper inspection conditions can be chosen by conducting fine adjustment so as to cause a shift from the acceleration voltage Ec to an acceleration voltage Ed.

In FIGS. 11 and 12, each of lines of the materials A and B illustrated with leader lines represents secondary electron yield ratio values obtained when the electric field is 0. Each of lines of the materials A and B which are not illustrated with leader lines represents secondary electron yield ratio values obtained when the electric field is changed. In other words, the secondary electron yield ratio of the upper layer (A in FIG. 11 and B in FIG. 12) is kept in the neighborhood of unity. For the purpose of keeping the difference in secondary electron yield ratio between the materials A and B at an appropriate value, the electric field is changed to change the line of secondary electron yield ratio.

Figure 15:
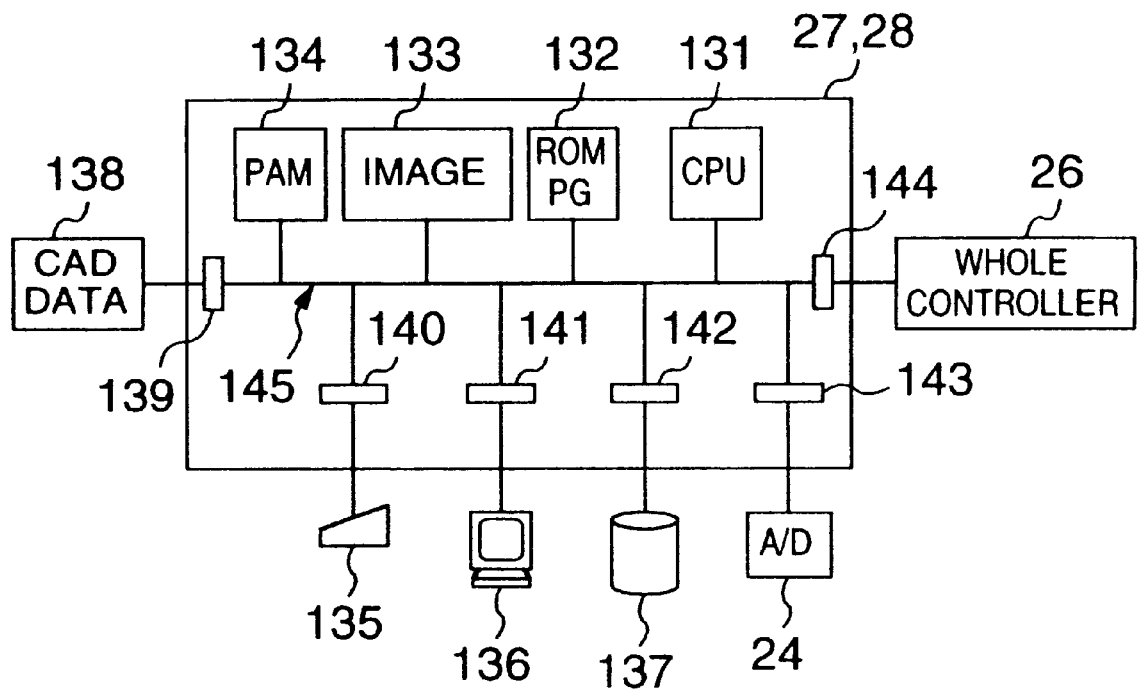
FIG. 15 is a schematic configuration diagram showing an embodiment of hardware configuration of an inspection condition corrector and an inspection condition setter according to the present invention.

FIG. 15 shows a concrete configuration of an embodiment of the inspection condition corrector 27 (27a, 27b) and the inspection condition setter 28. Numeral 131 denotes a CPU. Numeral 132 denotes a ROM for storing an inspection condition correction processing program. Numeral 133 denotes an image memory for storing digital images obtained from the A/D converter 24. Numeral 134 denotes a RAM for storing various data, corrected information of the inspection conditions, and preset inspection conditions. Numeral 135 denotes an input device including a keyboard and a mouse. Numeral 136 denotes a display device such as a display. Numeral 137 denotes an external storage device for storing information concerning the object such as CAD data. Numeral 138 denotes design information including CAD data obtained from the design system. Numerals 139 through 144 denote interface (I/F) circuits. Numeral 145 denotes a bus interconnecting the components.

Figure 13:
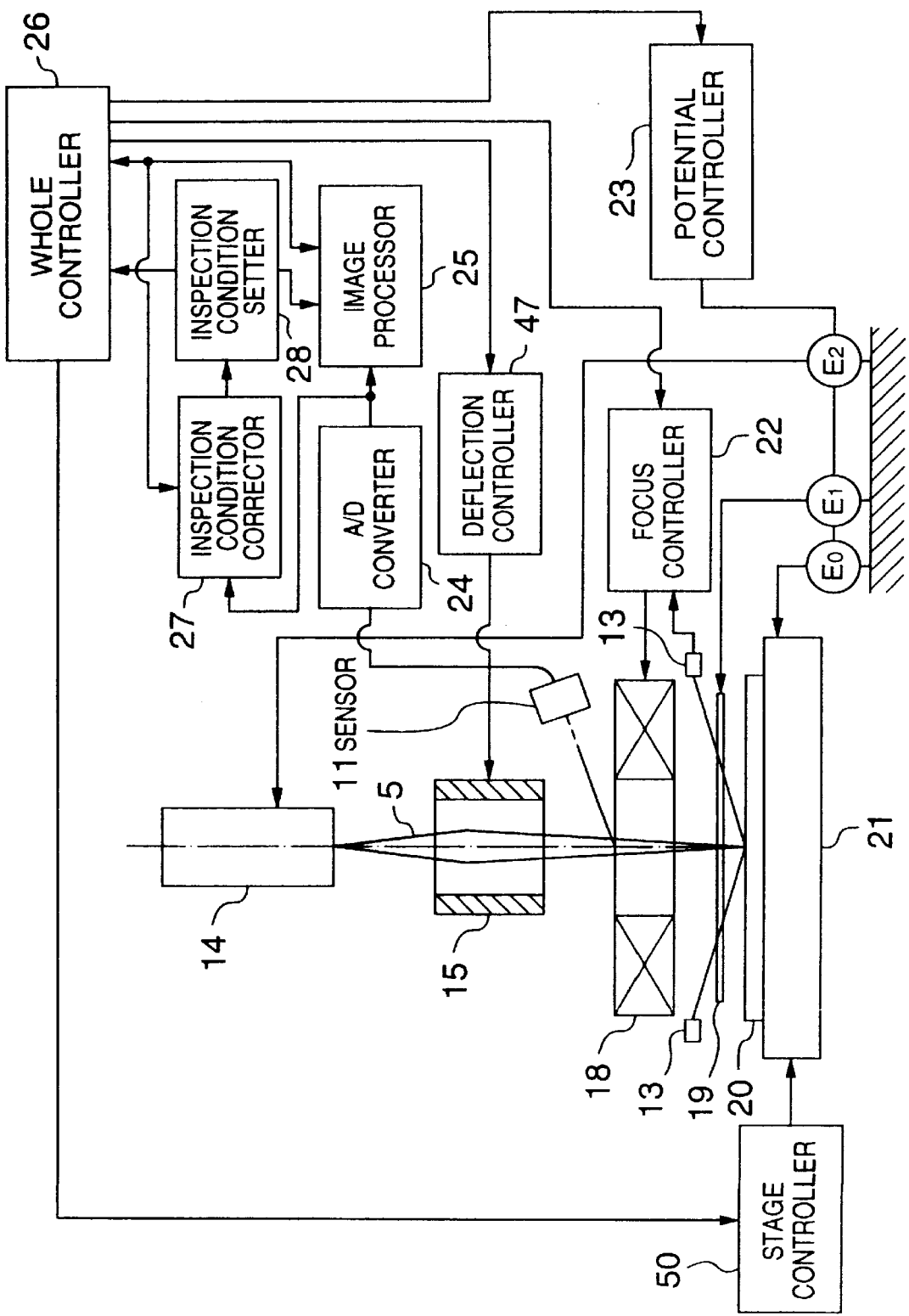
FIG. 13 is a diagram showing a first embodiment of a system for detecting a pattern on an object according to the present invention.

By a command issued by the whole controller 26, respective components shown in FIG. 13 are initialized and the stage controller 50 is controlled so as to move the object 20 to a predetermined location or a location specified by the user. According to a command issued by the whole controller 26, predetermined potential values $E_0$, $E_1$ and $E_2$ are set by the potential controller 23. A focus position determined by that condition is set by the focus controller 22. The object 20 is exposed to an electron beam yielded by the electron source 14 via the objective lens 18 while the electron beam is being deflected by the beam deflector 15 based on control of the deflection controller 47. Physical changes of secondary electrons and back-scattered electrons generated in the object 20 are detected by the sensor 11. A waveform or image signal representing the physical property of the object is thus detected and converted to a digital image signal by the A/D converter 24. The inspection condition corrector 27 stores the digital image signal supplied from the A/D converter 24 in the image memory 133 and displays this stored digital image signal on the display 136. For an area having a repeated pattern of the displayed digital image signal as shown in FIGS. 2, 4, 6, and 8, the user specifies a pattern located in the upper layer (material A or B) by using the input device 135. On the basis of this specification, the CPU 131 extracts an outline of the above described pattern (material A or B) from the detected digital image signal, stores the shape of the pattern (material A or B) in the external storage device (reference) 137, for example, and stores the quantity (such as dose quantity) of the electron beam used to irradiate the object 20 as well in the RAM 134, for example, by using the input device 135. As for the shape of the pattern (material A or B), it is not necessary to extract and derive the outline of the above described pattern (material A or B) from the detected digital image signal, and it is possible to specify an area on the basis of design information obtained as the CAD data 138. Furthermore, since information especially concerning the upper layer pattern (such as the shape [including the pattern width and pattern spacing] and thickness) is obtained from the CAD data 138, proper inspection conditions may be chosen by using this information.

In order to position a new area which is located on the object 20 and which is not subjected to exposure to the electron beam and charge-up, potential values $E_0$, $E_1$ and $E_2$ are subjected to change control with a constant pitch, for example, in the potential controller 23 for an area of each of specified repeated patterns while the stage of the wafer holder 21 is being scanned on the basis of the stage controller 50. An acceleration voltage ($E_0-E_2$) between the electron source 14 and the object 20, and a potential difference ($E_0-E_1$) proportionate to the electric field $\alpha$ on the object are thus controlled. A waveform or image signal representing the physical change of secondary electrons or back-scattered electrons generated from the area of each of specified and repeated patterns on the object 20 is detected by the sensor 11, converted to a digital image signal by the A/D converter 24, and stored in the image memory 133. In addition, data of potential values $E_0$, $E_1$ and $E_2$ subjected to change control in the potential controller 23 are received via the whole controller 26 and stored in the RAM 134, for example. For the digital image signal stored in the image memory 33, the CPU 131 calculates an image quality such as a secondary electron yield ratio $\eta$ in a place having an outside shape coinciding with that of a pattern (material A or B) stored (registered) in the external storage device (reference) 137 and a contrast $\rho$ of the entire image (given by a difference in brightness of digital image signal corresponding to the secondary electron yield ratio values $\eta$ of the materials A and B), and stores the calculated image quality in the RAM 134, for example. Out of image qualities stored in the RAM 134, for example, the CPU 131 derives potential values $E_0$, $E_1$ and $E_2$ existing in a small permissible value range of the secondary electron yield ratio $\eta$ around unity (existing in such a state that charge-up is suppressed to the utmost for the upper layer pattern) and having the highest image contrast $\rho$. The CPU 131 stores the derived potential values $E_0$, $E_1$ and $E_2$ in the inspection condition storage (the RAM 134 or the external storage device 137) as proper inspection conditions. By the way, the secondary electron yield ratio $\eta$ is defined as a ratio of yielded secondary electrons to the irradiation electron beam. The quantity of the irradiation electron beam (quantity of dose) is stored beforehand in the RAM 134, for example, and is already known. From the strength (brightness) of a digital image signal correlative to the yielded secondary electrons detected by the sensor 11 in a place coinciding with the outside shape of a pattern (material A or B), therefore, the CPU 131 can calculate the secondary electron yield ratio $\eta$ as the ratio to the quantity of irradiation electron beam. In this way, the secondary electron yield ratio $\eta$ can be calculated as the ratio of the yielded secondary electrons detected by the sensor 11 to the quantity of the irradiation electron beam.

Furthermore, the contrast $\rho$ in the entire image is given by the ratio of brightness intensity averaged over the lower layer pattern to brightness intensity averaged over the upper layer pattern (in a small permissible value of secondary electron yield ratio $\eta$ around unity). In other words, the contrast $\rho$ of the entire image is given from the intensity (brightness) of the digital image signal correlative to the yielded secondary electrons detected by the sensor 11 in the upper layer pattern (material A) area and its peripheral area (its neighboring area, i.e., lower layer pattern area) (material B) as shown in FIG. 8B, for example. In this case, the contrast $\rho$ of the entire image is given as the ratio of bright intensity averaged over a plurality of peripheral areas (neighboring areas) to dark intensity (in a small permissible value range of secondary electron yield ratio $\eta$ around unity) averaged over a plurality of pattern (material A) areas. Since the charge-up is affected by the scan of the electron beam as shown in FIGS. 6B and 6C, it is necessary to calculate the contrast $\rho$ of the entire image with due regard to this point. In other words, the contrast $\rho$ of the entire image is given as the ratio of bright intensity (in a small permissible value range of secondary electron yield ratio $\eta$ around unity) averaged over a portion of a plurality of upper layer pattern areas (material A) affected by the scan to dark intensity averaged over a plurality of peripheral areas of the upper layer pattern (material A). As a matter of course, it is apparent that the contrast $\rho$ of the portions which are included in a plurality of upper layer pattern areas (material A) and which are not affected by the scan becomes better. As shown in FIG. 8B or FIGS. 6B and 6C, therefore, the CPU 131 can calculate the contrast $\rho$ of the entire image from the intensity (brightness) of a digital image signal correlative to the yielded secondary electrons detected by the sensor 11 in the pattern (material A) area and its peripheral area (neighboring area).

If this concept is expanded so as to be defined as the sum total of the electron beam quantity which is not stored in the object due to back-scattering of the electron beam used to irradiate the object 20, and irradiation, transmittance, leak, etc. of secondary electrons, then a plurality of sensors may be used instead of a single sensor 11 to measure terms other than secondary electrons and the measured value may be used in the case where the terms other than secondary electrons cannot be neglected.

A method for setting optimum inspection conditions will now be described. A two-dimensional image obtained by scanning in the Y direction at low speed while repetitively scanning with an electron beam in the X direction at high speed is compared with a two-dimensional image obtained by scanning in the X direction at low speed while repetitively scanning in the Y direction at high speed. The sum $\sigma$ of pixel contrast difference values over the entire image for each image, and the image contrast $\rho$ between the upper layer pattern and the lower layer pattern (i.e., spacing between upper layer patterns) in either of the images are calculated. They are stored as the image quality. (A small value of the sum $\sigma$ means that charge-up scarcely occurs in such a direction that a scan is effected with an electron beam at high speed as shown in FIG. 6A [i.e., it means that the secondary electron yield ratio $\eta$ is approximately unity]. On the contrary, a large value of the sum $\sigma$ means that charge-up occurs in such a direction that a scan is effected with an electron beam at high speed as shown in FIGS. 6B and 6C.) Among stored image qualities, potential values $E_0$, $E_1$ and $E_2$ having the sum $\sigma$ of pixel contrast difference values over the entire image which is equal to or less than a fixed permissible value (which means that charge-up scarcely occurs as shown in FIG. 6A) and having the highest value of the image contrast $\rho$ may be stored as corrected inspection conditions.

An alternative method for setting optimum inspection conditions will now be described. The same place is scanned with an electron beam to detect an image a plurality of times. Those images are compared. The sum $\sigma$ of pixel contrast difference values over the entire image, and the image contrast $\rho$ between the upper layer pattern and the lower layer pattern (i.e., spacing between upper layer patterns) in one of the images are calculated. They are stored as the image quality. (A small value of the sum $\sigma$ means that charge-up scarcely occurs even if the same place is scanned with an electron beam [i.e., it means that the secondary electron yield ratio $\eta$ is approximately unity]). Among stored image qualities, potential values $E_0$, $E_1$ and $E_2$ having the sum $\sigma$ of pixel contrast difference values over the entire image which is equal to or less than a fixed permissible value (which means that charge-up scarcely occurs) and having the highest value of the image contrast ρ or having a minimum change of an average secondary electron yield ratio η over the entire image may be stored as corrected inspection conditions.

Instead of setting the optimum inspection conditions wholly in an automatic manner, a calculation result of information required for determining the inspection conditions or the detected image itself may be presented to an operator. From the presented information, the operator determines the optimum inspection conditions. Even when this method is used, a similar effect can be achieved. The evaluation parameters of the image quality and the method for selecting the optimum inspection conditions are not limited to those of the above described embodiment.

The method for setting the inspection conditions on the basis of the information of the object will now be described. Beforehand, relations of the secondary electron yield ratio η to the acceleration voltage E on the object of each material and the electric field α on the object as shown in FIGS. 1 and 10 are derived and stored in the external storage device 137 or the RAM 134 of the inspection condition corrector 27 shown in FIG. 15. At this time, a waveform or image signal representing a physical change of secondary electrons and back-scattered electrons generated from areas of each of specified and repeated patterns on the object 20 is detected by the sensor 11, converted to a digital image signal by the A/D converter 24, and stored in the image memory 133, and the secondary electron yield ratio η is calculated from this stored digital image signal, as described above with reference to the embodiment. Instead of this method, calculation may be effected by using a theoretical analysis method.

So as to correspond to the process index or object index representing the surface structure of the object 20, the material (i.e., material of the upper layer pattern) located in the upper layer of a section structure including a plurality of materials and forming the object (i.e., object to be inspected), the material (i.e., material of the lower layer pattern) located in the lower layer, the layer thickness and shape of the upper layer pattern, and the scan condition of the electron beam are specified by using the input device 135. The CPU 131 selects inspection conditions (such as potential values $E_0$, $E_1$ and $E_2$) suitable for the surface structure of the specified object 20 from the above described relation table stored in the external storage device 137 or the RAM 134, stores the inspection conditions (such as potential values $E_0$, $E_1$ and $E_2$) in the RAM 134 and the like in association with the process index or object index representing the surface structure of the object 20. The selection of inspection conditions is conducted by looking for such conditions that the electron yield ratio η from the material located in the upper layer (upper layer pattern) is approximately unity, the second electron yield ratio η from the material located in the lower layer (lower layer pattern) is in a predetermined range of 0.7 to 1.2, for example, and has a difference of some degree with respect to the electron yield ratio η from the material located in the upper layer (upper layer pattern), and deriving potential values $E_0$, $E_1$ and $E_2$ associated with such conditions. It is a matter of course that the inspection conditions must be chosen with due regard to the layer thickness and shape of the upper layer pattern and the scan condition of the electron beam. It is because the charge-up characteristic especially for the upper layer pattern changes.

Inspection condition setting in the inspection condition setter 28 will now be described. The inspection conditions chosen beforehand in the inspection condition corrector 27 are stored in the RAM 134. In the inspection condition setter 28, therefore, the process index or object index representing the surface structure of the object 20 is inputted by using the input device 135. Thereby, corrected inspection condition (potential values $E_0$, $E_1$ and $E_2$) can be read out from the RAM 134 and set in the potential controller 23 via the whole controller 26.

On the basis of the inspection conditions (potential values $E_0$, $E_1$ and $E_2$) set in the inspection condition setter 28, the potential controller 23 controls the potential $E_0$ for the object 20, the potential $E_1$ for the voltage providing device 19 for providing the electric field α on the object, and the the potential $E_2$ for the electron source 14. The value ($E_0-E_2$) represents the potential difference from the electron source 14 to the object (sample) 20, and it is the acceleration voltage E shown in FIG. 1. Furthermore, ($E_0-E_1$) is proportionate to the electric field α on the object (sample) surface. FIG. 12 shows the secondary electron yield ratio η obtained when the electric field α (proportionate to ($E_0-E_1$)) is changed. If the electric field α is positive, i.e., secondary electrons are decelerated, then the secondary electrons become difficult to be yielded, resulting in a decreased secondary electron yield ratio η. On the other hand, if the electric field α is negative, i.e., secondary electrons are accelerated, then the secondary electrons become easy to be yielded, resulting in an increased secondary electron yield ratio η. By controlling these two parameters in the potential controller 23 according to a predetermined relation, it is possible to attain such a state that the secondary electron yield ratio η is approximately unity (i.e., is in a small permissible value range around unity) for the material located in the upper layer (upper layer pattern) and the charge-up can be thus suppressed to the utmost for the upper layer pattern. Thus the image contrast ρ between the material located in the upper layer (upper layer pattern) and the material which is not located in the upper layer (lower layer pattern) can be corrected. Under such a condition that charge-up is not caused for the upper layer pattern, therefore, an image having sufficient contrast can be detected.

Furthermore, owing to them, minute defects and dimensions can be inspected with high reliability in association with the surface structure of the object. As a result, it became possible to inspect minute pattern defects and dimensions of a wafer having a finer pattern width in a fabrication line. Especially by using an electron beam, defects and dimensions in a pattern such as an optically transparent oxide film or resist can be inspected with high reliability.

A second embodiment of a system for detecting a pattern on an object such as a semiconductor wafer by using an electron beam according to the present invention will now be described by referring to FIG. 16. The present system (inspection apparatus) includes an electron source 14 for generating an electron beam, a beam deflector 15 for effecting a scan with the electron beam and conducting imaging, an objective lens (electric optics) 18 for focusing the electron beam on a wafer 20 which is the object, a potential providing device 19 such as a grid disposed between the objective lens 18 and the wafer (object) 20, a wafer holder 21 for holding the wafer 20 mounted thereon, a stage 46 for scanning and positioning the wafer holder 21, an E×B (a device provided with an electric field E and a magnetic field B) 17 for collecting secondary electrons generated from the surface of the wafer 20 to a secondary electron detector 16, a height sensor 13, a focus controller 22 for adjusting the focus position of the objective lens 18 on the basis of the height information of the wafer surface obtained from the height sensor 13, a deflection controller 47 for controlling the beam deflector 15 to conduct scanning with the electron beam, a potential controller 21 including a wafer holder potential adjuster 49 for adjusting the potential $E_0$ of the wafer holder 21, a grid potential adjuster 48 for controlling the potential $E_1$ of the voltage providing device 19 such as a grid, and an electron source potential adjuster 51 for controlling the voltage $E_2$ of the electron source 14, an A/D converter 24 for conducting A/D conversion on a signal supplied from the secondary electron detector 16, an image processor 25 including an image memory 52 and an image comparator 53 to process the digital image subjected to A/D conversion in the A/D converter 24, an inspection condition corrector 27a for correcting the inspection conditions on the basis of the digital image subjected to A/D conversion, an inspection condition setter 28 for setting and storing inspection conditions corrected and chosen by the inspection condition corrector 27a, a stage controller 50 for controlling the stage 46, a whole controller 26 for controlling the whole of them, and an inspection vacuum chamber 45 for housing the electron source 14, the beam deflector 15, the objective lens (electric optics) 18, the voltage providing device 19 such as the grid, and the wafer 20 which is the object (sample).

The sequence of the present system is shown in FIG. 14B. In this scheme, inspection conditions are preset before inspection. For each of kinds having changed surface section structures, a sample (wafer) 20 is loaded (step 31b). (The surface section structure changes from lot to lot and from process to process. The surface section structure of the object to be inspected might be a resist pattern completed by exposure development, an insulator pattern having through-holes connecting the upper layer wiring and lower layer wiring between wiring layers, or an insulator pattern, for example.) The object is aligned (step 32b). In the inspection condition corrector 27a, inspection conditions are then corrected (step 33b). Each object is unloaded (step 36b).

The correction processing of the inspection conditions conducted in the inspection condition corrector 27a (step 33b) will now be described. A command is issued to the whole controller 26 by the CPU 131. A command supplied from the whole controller 26 initializes the components, drives and moves the stage 46 to a place specified by the user, and sets the focus position of the objective lens 18 by using the focus controller 22 so as to focus on the height of the sample (wafer) 20 detected by the height sensor 13. The CPU 131 displays predetermined menus stored in the external storage device 137 and the RAM 134 on the display device 136. Out of these menus, the user selects a menu closest to the solid structure (section structure) of the sample surface (such as especially the material of the upper layer pattern and the material of the lower layer pattern) by specifying it with the input device 135 such as a mouse. The CPU 131 sets the potential $E_2$ of the electron source 14, the potential $E_1$ of the voltage providing device 19 such as the grid, and the potential $E_0$ of the wafer holder 21 registered in that menu respectively for the electron source potential adjuster 51, the grid potential adjuster 48, and the wafer holder potential adjuster 48 included in the potential controller 23 via the whole controller 26. By issuing a command via the whole controller 26, the CPU 131 sets the focus position determined by the inspection conditions by using the focus controller 22. By issuing a command via the whole controller 26, the CPU 131 exposes the wafer 20 to an electron beam from the electron source 14 via the objective lens 18. Secondary electrons generated from the surface of the sample (wafer) 20 are collected by the E×B 17. An image is detected by the secondary electron detector 16 and converted to a digital image signal by the A/D converter 24. The CPU 131 stores the digital image signal obtained from the A/D converter 24 in the image memory 133 temporarily and displays it on the display device 135. Out of this displayed digital image, the user specifies a pattern having repetition and located in the upper portion by using the input device 135 such as a mouse. By extracting the outline of that pattern, the shape information of the pattern is calculated and stored in the RAM 134 or the external storage device 137. In this way, the pattern shape information inclusive of the repetition pitch is information depending upon the object to be inspected. Therefore, the pattern shape information may be directly obtained from the CAD data 138 and stored in the RAM 134 or the external storage device 137. By specification with respect to an image detected from the secondary electron detector 16 on the basis of the pattern shape information stored in the RAM 134 or the external storage device 137, therefore, the secondary electron yield ratio η obtained from an area of the upper layer pattern or an area of the lower layer pattern can be calculated.

In other words, by specifying a partial area of a detected image coinciding with the pattern shape of the upper layer pattern specified beforehand by some means, an image of the upper layer area and an image of the lower layer area are discriminated in the image, and the second electron yield ratio is specified from the image data.

In response to a command given from the CPU 131, an area on the wafer subjected to exposure to an electron beam is then made a new surface area on which charge-up does not occur. For this purpose, the stage controller 50 is driven and controlled via the whole controller 26. While the stage 46 having the wafer holder 21 installed thereon is thus being scanned, the potential controller 23 is controlled via the whole controller 26 so as to change the potential values $E_0$, $E_1$ and $E_2$ with a predetermined pitch. In response to a command given via the whole controller 26, focus offset determined by the condition is set in the focus controller 22. In response to a command given via the whole controller 26, the wafer 20 is exposed to an electron beam from the electron source 14 via the objective lens 18. According to the changes in the potential values $E_0$, $E_2$ and $E_2$, secondary electrons generated from the surface area of the repeated upper layer pattern and lower layer pattern on the wafer 20 are collected by the E×B 17. An image is thus detected by the secondary electron detector 16 and converted to a digital image signal by the A/D converter 24. According to the changes in the potential values E0, E1 and E2 obtained by the A/D converter 24, the CPU 131 stores the digital image obtained from the surface area of the repeated upper layer pattern and lower layer pattern on the wafer 20 in the image memory 133. In the digital image according to the changes in the stored potential values $E_0$, $E_2$ and $E_2$, it is specified whether the area is an area of the upper layer pattern or an area of the lower layer pattern on the basis of the shape information of the pattern stored in the RAM 134 or the external storage device 137. Thereby, the secondary electron yield ratio η in the area of the upper layer pattern and the area of the lower layer pattern according to changes of the potential values $E_0$, $E_1$ and $E_2$, and the image quality such as the contrast ρ in the entire image are calculated and stored in the external storage device 137 or the like. (The contrast ρ is represented by a difference between the secondary electron yield ratio η in the area of the upper layer pattern and the secondary electron yield ratio η in the area of the lower layer pattern.) As shown in FIGS. 11 and 12, the CPU 131 derives the potential values $E_0$, $E_1$ and $E_2$ existing in a small permissible value range of the secondary electron yield ratio η from the upper layer pattern around unity (nearly approximated to unity) (existing in such a state that charge-up is suppressed to the utmost for the upper layer pattern), existing in a large permissible value range of the secondary electron yield ratio η from the lower layer pattern around unity (existing in such a state that charge-up is suppressed as far as possible for the lower layer pattern), and yielding a proper image contrast value ρ. The CPU 131 stores the derived potential values $E_0$, $E_2$ and $E_2$ in the external storage device 137 or the like as inspection conditions (potential values $E_0$, $E_1$ and $E_2$) in association with a kind of a change of the surface section structure of the object to be inspected (including the process). At the time of image detection, the focus controller 22 causes follow-up control to a focus position obtained by adding the focus offset to the output of the height sensor 13. Furthermore, on the basis of actually inspected defect information (especially false detection information) obtained from the image comparator 53, for example, included in the image processor 25 or the inspection judgment standard (defect judgment standard) in the image comparator 53, the CPU 131 calibrates (adjusts) the small permissible value range around unity preset for the secondary electron yield ratio η obtained from the upper layer pattern and the large permissible value range around unity preset for the secondary electron yield ratio η obtained from the lower layer pattern. Thereby, the CPU 131 amends the inspection conditions (potential values $E_0$, $E_1$ and $E_2$). In the inspection condition setter 28, the inspection conditions (potential values $E_0$, $E_2$ and $E_2$) are thus reset. In this way, false detection can be prevented in actual inspection conducted in the image processor 25. Because the permissible value for the secondary electron yield ratio η relates to the inspection judgment standard (defect judgment standard) in the image comparator 53. As a matter of course, the CPU 131 may directly calibrate the inspection conditions (potential values $E_0$, $E_1$ and $E_2$) on the basis of history associated with the surface section structure of the object to be inspected concerning the actually inspected defect information (especially false detection information) obtained from the image comparator 53, for example, included in the image processor 25. Furthermore, when calculating the secondary electron yield ratio η obtained from the upper layer pattern, or when setting a value in a small permissible value range around unity for this secondary electron yield ratio η, the CPU 131 can select more proper inspection conditions by conducting adjustment on the basis of information such as the shape (including the pattern width and pattern spacing) and thickness of the upper layer pattern obtained from the CAD data 138.

Inspection processing conducted on the object to be actually inspected (wafer) 20 will now be described. Before loading the object to be actually inspected (wafer) 20, a kind of a change of the surface section structure of the object to be actually inspected (including the process) is inputted to the inspection condition setter 28 by using the input device 135. Thereby, inspection conditions (potential values $E_0$, $E_1$ and $E_2$) corresponding to the object to be actually inspected stored in the external storage device 137 are chosen, and set and stored in the RAM 134. Subsequently, the object to be actually inspected (wafer) 20 is loaded on the basis of a command issued by the whole controller 26 (step 31c). Alignment is conducted (step 32c). In accordance with inspection conditions (potential values $E_0$, $E_1$ and $E_2$) corresponding to the kind of the object to be actually inspected (variety and process of the wafer) which is set and stored beforehand in the RAM 134 of the inspection condition setter 28, the electron source potential adjuster 51, the grid potential adjuster 48, and the wafer holder potential adjuster 48 forming the potential controller 23 are controlled so as to obtain the potential values $E_0$, $E_1$ and $E_2$ (step 34c). The focus offset determined by the conditions is set by the focus controller 22. After setting, the stage 46 is driven and run in the Y direction at a constant speed under the control of the stage controller 50 on the basis of a command given from the whole controller 26. While the stage 46 is being thus run, scanning is repetitively conducted in the X direction at high speed with the electron beam supplied from the electron source 14 by using the beam deflector 15 under the control of the deflection controller 47. Secondary electrons obtained from the surface of the object 20 to be inspected are collected into the secondary electron detector 16 by the E×B 17. Two-dimensional secondary electron images are consecutively detected by the secondary electron detector 16, and converted to two-dimensional digital secondary electron image signals by the A/D converter 24. The two-dimensional digital secondary electron image signals are stored in the image memory 52 included in the image processor 25. Among detected two-dimensional digital secondary electron image signals and two-dimensional digital secondary electron image signals stored in the image memory 52, image signals expected to be originally the same patterns such as image signals of each chip are compared with each other by the image comparator 53. Different portions are detected as defects. Information concerning defects including coordinates of positions where defects have occurred is stored in a memory of the image processor 25 or the whole controller 26 (step 35c). If all places to be inspected have been inspected, the object 20 to be inspected is unloaded from the wafer holder 21 (step 36c).

Variants different from the above described correction processing of the inspection conditions in the inspection condition corrector 27a will now be described.

In a first variant of the present embodiment, the CPU 131 calculates an average secondary electron yield ratio η of a range registered and specified beforehand in the reference instead of calculating the secondary electron yield ratio η of the place registered and specified beforehand in the reference. From the secondary electron yield ratio η in an area of the upper layer pattern and an area of the lower layer pattern according to changes in the potential values $E_0$, $E_2$ and $E_2$, the CPU 131 calculates an average secondary electron yield ratio η of a range registered and specified beforehand in the external storage device (reference) 137 (a range including a plurality of repetitions of an area of the upper layer pattern and an area of the lower layer pattern). The CPU 131 selects such inspection conditions (potential values $E_0$, $E_2$ and $E_2$) that this calculated average secondary electron yield ratio η comes in a small value range around unity (i.e., it becomes a value which can be nearly approximated to unity). Thereby, the contrast ρ falls to some degree. Since charge-up does not occur in an average manner on the surface of the object to be inspected, however, stable inspection can be conducted for a long time.

In a second variant of the present embodiment, the CPU 131 calculates the average secondary electron yield ratio η of the range registered and specified beforehand in the reference besides the calculation of the secondary electron yield ratio η of a place registered and specified beforehand in the reference, and selects such inspection conditions that the weighted average of them is close to unity. In other words, the CPU 131 calculates the secondary electron yield ratio η obtained from an area of the upper layer pattern according to changes of the potential values $E_0$, $E_2$ and $E_2$ and the secondary electron yield ratio η over the above described range, and selects such inspection conditions (potential values $E_0$, $E_1$ and $E_2$) that the weighted average of them is close to unity. Thereby, the charge-up of the upper layer pattern and the average charge-up can be optimized, and stable inspection can be conducted for a long time.

In a third variant of the present embodiment, the CPU 131 calculates the secondary electron yield ratio $\eta$ of a place specified by an operator instead of calculating the secondary electron yield ratio $\eta$ of the place registered and specified beforehand in the reference. In other words, an area on the wafer subjected to exposure to an electron beam is then made a new surface area on which charge-up does not occur, in response to a command given from the CPU 131. For this purpose, the stage controller 50 is driven and controlled via the whole controller 26. While the stage 46 having the wafer holder 21 installed thereon is thus being scanned, the potential controller 23 is controlled via the whole controller 26 so as to change the potential values $E_0$, $E_1$ and $E_2$ with a predetermined pitch. In response to a command given via the whole controller 26, focus offset determined by the condition is set in the focus controller 22. In response to a command given via the whole controller 26, the wafer 20 is exposed to an electron beam from the electron source 14 via the objective lens 18. According to the changes in the potential values $E_0$, $E_1$ and $E_2$, secondary electrons generated from the surface area of the repeated upper layer pattern and lower layer pattern on the wafer 20 are collected by the E×B 17. An image is thus detected by the secondary electron detector 16 and converted to a digital image signal by the A/D converter 24. According to the changes in the potential values $E_0$, $E_1$ and $E_2$ obtained by the A/D converter 24, the CPU 131 stores the digital image obtained from the surface area of the repeated upper layer pattern and lower layer pattern on the wafer 20 in the image memory 133. The digital image according to the changes in the stored potential values $E_0$, $E_1$ and $E_2$ is displayed on the screen of the display device 136. For the digital image according to the changes in the stored potential values $E_0$, $E_1$ and $E_2$, a place (area) where the secondary electron yield ratio $\eta$ is to be calculated is specified by using the input device 135. Thereby, the secondary electron yield ratio $\eta$ and the contrast $\rho$ can be calculated in this specified place (area). As a result, registration into the reference is not needed. Even for a pattern which does not necessarily have repetitions, inspection conditions can be chosen. While specifying the potential values $E_0$, $E_1$ and $E_2$ by using the input device 135 and observing the digital image according to changes of the potential values $E_0$, $E_2$ and $E_2$ displayed on the screen of the display device 136, such inspection conditions (potential values $E_0$, $E_1$ and $E_2$) that charge-up is not seen in the upper layer pattern and proper contrast $\rho$ is obtained can be directly chosen and stored in the external storage device 137 so as to be associated with the kind of the object to be inspected (section structure of the surface) without calculating the secondary electron yield ratio $\eta$ and the contrast $\rho$. In the case where the CPU 131 attempts to correct the inspection conditions (potential values $E_0$, $E_1$ and $E_2$) by calculating the secondary electron yield ratio $\eta$ and the contrast $\rho$, correction of the inspection conditions can be confirmed by displaying the corrected digital image on the screen of the display device 136.

In a fourth variant of the present embodiment, the CPU 131 calculates an average secondary electron yield ratio $\eta$ of the entire image or in a range specified by the operator instead of calculating the secondary electron yield ratio $\eta$ of the place registered and specified beforehand in the reference. As a result, registration into the reference is not needed. Even for a pattern which does not necessarily have repetitions, inspection conditions (potential values $E_0$, $E_1$ and $E_2$) can be chosen, and charge-up does not occur in an average manner. Therefore, stable inspection can be conducted for a long time.

In a fifth variant of the present embodiment, the CPU 131 does not calculate the secondary electron yield ratio $\eta$ of the place registered and specified beforehand in the reference. Instead, the CPU 131 detects a digital image using secondary electrons in a plurality of scan methods (such as a method of changing the scan direction as shown in FIGS. 6B and 6C or a method of scanning the same place a plurality of times in succession), calculates the degree of coincidence between them (i.e., the degree of absence of difference between digital images), and selects inspection conditions (potential values $E_0$, $E_1$ and $E_2$) having a high degree of coincidence. In the case where charge-up occurs on the surface of the object to be inspected, a change should occur in the charge-up phenomenon by conducting scanning with an electron beam a plurality of times during a comparatively short time even if there is a charge-up ease phenomenon. In the case where a change is not seen (i.e., the degree of coincidence is high) between detected digital images, therefore, it is indicated that charge-up does not occur on the surface of the object to be inspected. Furthermore, as for the contrast $\rho$, it can be calculated from the detected digital image. Owing to this, inspection conditions can be chosen without a registered reference or specification by the operator. On the basis of a difference (change) between detected digital images, the charge-up phenomenon on the surface of the object to be inspected, on the contrary, can be grasped.

Figure 17:
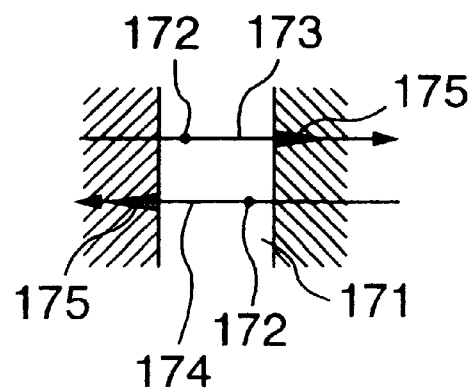
FIG. 17 is a diagram illustrating the phenomemon of charge-up occurring on the down stream side of a pattern as the detected image signal in the case where reciprocating scanning is conducted with an electron beam.

In a sixth variant of the present embodiment, the CPU 131 does not calculate the secondary electron yield ratio $\eta$ of the place registered and specified beforehand in the reference. Instead, a pattern which can be detected as the same digital image signal even if the scan direction is changed by 180 degrees on the object is registered beforehand in the reference. By specifying a position of the pattern, an electron beam 172 used to irradiate the pattern 171 is aligned via the whole controller 26 as shown in FIG. 17. Thereafter, the scan direction of the electron beam is changed with respect to the pattern 171 by 180 degrees. Reciprocating scanning is thus conducted with the electron beam 172 as represented by 173 and 174. A digital image signal obtained from one of scan lines is inverted by 180 degrees so as to form a mirror image. This inverted digital image signal is compared with a digital image signal obtained from the other scan line, and the degree of their coincidence is calculated. Inspection conditions (potential values $E_0$, $E_1$ and $E_2$) having a high degree of coincidence and proper contrast $\rho$ calculated on the basis of a detected digital image are chosen.

FIG. 17 shows an example of a pattern which should provide the same pattern when inverted by 180 degrees so as to form a mirror image.

With respect to this pattern, an image obtained by scanning in the direction 173 and an image obtained by scanning in the direction 174 are acquired. One of the two images is inverted so as to form a mirror image, and comparison is effected. Originally, this pattern is a pattern which should provide the same pattern when inverted by 180 degrees so as to form a mirror image. If the degree of pattern coincidence is high, therefore, it can be said that pattern detection is accomplished normally. Otherwise, it is meant that the pattern detection is not proper.

In the case where charge-up has occurred in the pattern 171, a tail 175 appears in the downstream of the scan line in the pattern 171 as the digital image in each of the reciprocating scan lines 173 and 174. By comparing a digital image signal obtained by inverting a digital image obtained from one of the scan lines by 180 degrees with a digital image signal obtained from the other of the scan lines, therefore, the tail 175 appears on both sides of the pattern 171 as noncoincidence (difference) in the case where charge-up has occurred in the pattern 171. If charge-up does not occur in the pattern 171, then the tail 175 does not appear in the downstream of the scan line in the pattern 171 as the digital image in each of the reciprocating scan lines 173 and 174, resulting in a high degree of coincidence. In other words, inspection conditions (potential values $E_0$, $E_2$ and $E_2$) which do not cause the charge-up in the pattern 171 can be chosen. According to this variant, proper inspection conditions can be chosen without information of the section structure of the object to be inspected. By comparing a digital image signal obtained by inverting a digital image obtained from one of the scan lines by 180 degrees with a digital image signal obtained from the other of the scan lines and detecting the tail 175 appearing as noncoincidence (difference) on both sides of the pattern 171, the charge-up phenomenon which has appeared in the pattern 171 can be grasped.

In a seventh variant of the present embodiment, the CPU 131 does not calculate the secondary electron yield ratio η of the place registered and specified beforehand in the reference. Instead, a certain area on the object to be inspected is scanned with an electron beam a plurality of times to detect respective digital images as shown in FIGS. 9A and 9B. For example, a digital image detected in a first scan is compared with a digital image in a scan conducted a plurality of scans after, and the degree of coincidence between them is calculated. Inspection conditions (potential values $E_0$, $E_2$ and $E_2$) having a high degree of coincidence and having proper contrast ρ calculated on the basis of the detected digital image are chosen. If charge-up occurs in the upper layer pattern, a difference between a digital image detected in a first scan is compared with a digital image in a scan conducted a plurality of scans after, for example, becomes large. If on the contrary charge-up does not occur in the upper layer pattern, then the difference between a digital image detected in a first scan is compared with a digital image in a scan conducted a plurality of scans after, for example, is little and the degree of coincidence becomes high. Therefore, inspection conditions (potential values $E_0$, $E_1$ and $E_2$) causing no charge-up in the upper layer pattern can be chosen. According to this variant, proper inspection conditions can be chosen without information of the surface section structure of the object to be inspected. In an eighth variant of the present embodiment, inspection conditions are not chosen automatically. Instead, the CPU 131 presents image quality evaluation parameters, such as the secondary electron yield ratio η of a specified place, the degree of coincidence between digital images detected by using a plurality of scan methods, and contrast of digital images, to the operator by displaying them on the display device, for example. Thus, the operator selects inspection conditions. According to the present variant, proper inspection conditions can be chosen by using a simple configuration.

In a ninth variant of the present embodiment, inspection conditions are not chosen automatically. Instead, the CPU 131 presents a digital image detected in association with changed potential values $E_0$, $E_1$ and $E_2$ to the operator by displaying them on the display device 136, for example. Thus, the operator selects proper inspection conditions (potential values $E_0$, $E_2$ and $E_2$) on the basis of the observed digital image. According to the present variant, proper inspection conditions can be chosen without information of the surface section structure of the object to be inspected and with a simple configuration.

Furthermore, it is apparent that a plurality of variants heretofore described may be applied to select proper inspection conditions (potential values $E_0$, $E_1$ and $E_2$).

Figure 18:
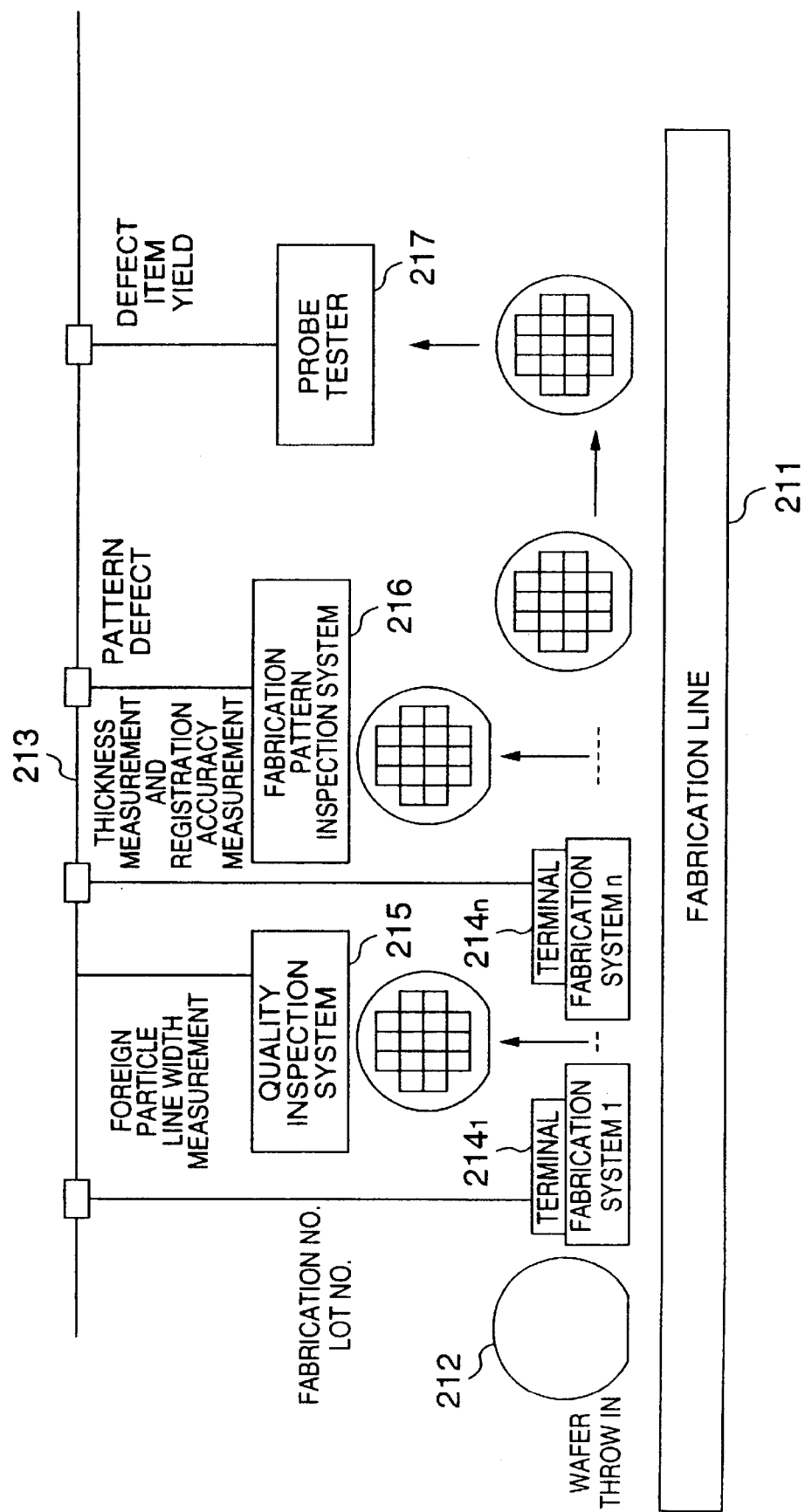
FIG. 18 is a diagram showing an embodiment of a semiconductor fabrication line according to the present invention.

As heretofore described, the present embodiment makes it possible to inspect wafers (objects to be inspected) of various varieties and processes under proper inspection conditions (potential values $E_0$, $E_2$ and $E_2$). In addition, it can be realized to inspect defects and dimensions of patterns on wafers (objects to be inspected) having various surface section structures not only of a specific variety but also of a plurality of processes. As a result, the present embodiment can be used as a fabrication pattern inspection system 216 as shown in FIG. 18. It can be realized to conduct on-line inspection on minute defects and dimensions in a resist pattern or an insulator pattern having a surface section structure which cannot be optically inspected in the middle of the flow of the fabrication process. As a matter of course, the inspection can be realized off-line.

Figure 16:
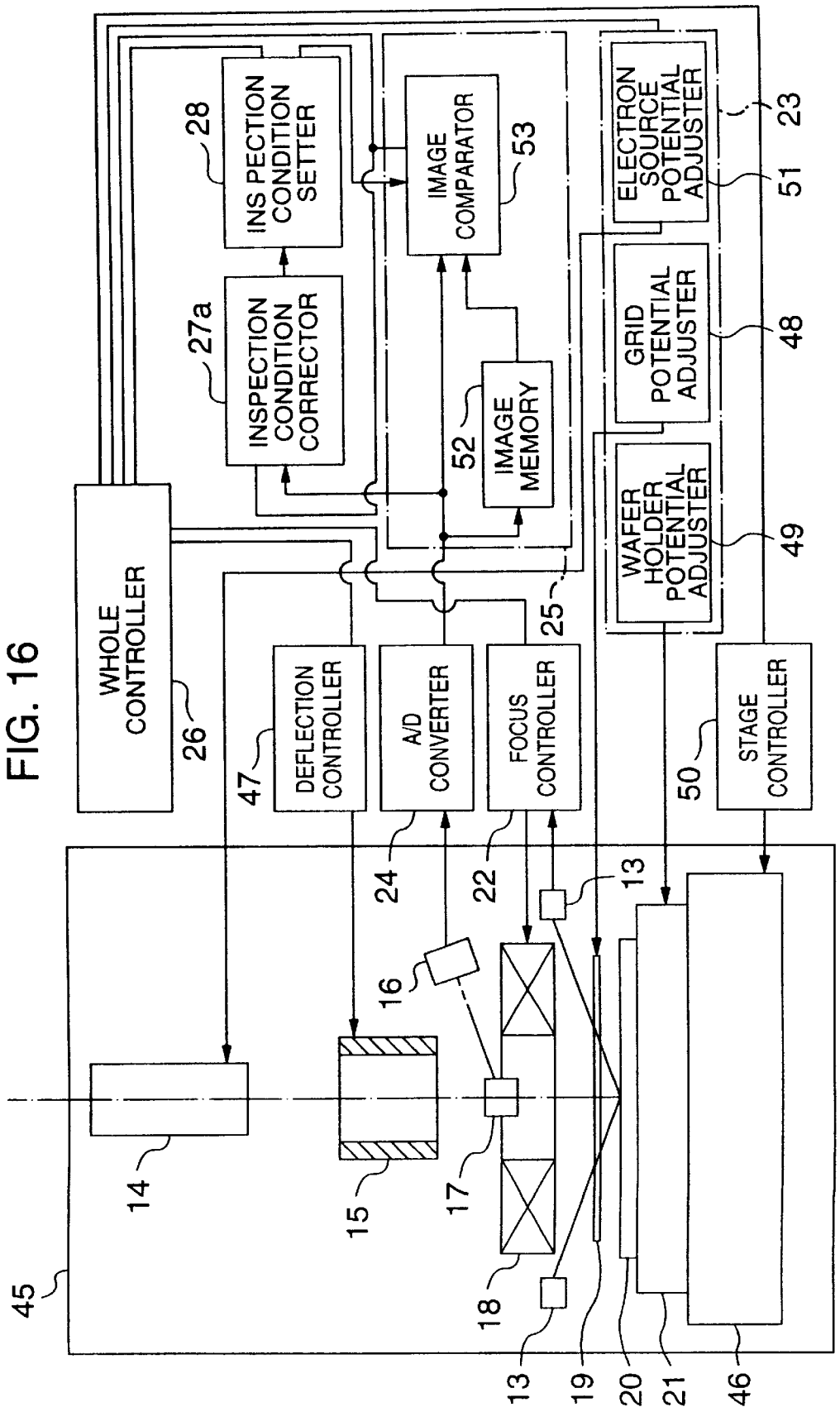
FIG. 16 is a diagram showing a second embodiment of a system for detecting a pattern on an object according to the present invention.

FIG. 18 shows the schematic configuration of a fabrication system using the embodiment of FIG. 16 as the fabrication pattern inspection system 216. In the fabrication system, wafers (semiconductor substrates) 212 are thrown into a fabrication line 211 and fabrication is conducted by using a large number of fabrication facilities 1 through n. Numeral 213 denotes a quality control network for controlling various fabrication conditions (including fabrication lots) inputted from terminals 2141 through 214n installed in association with a large number of fabrication facilities 1 through n forming the fabrication line, and quality data inspected by a quality inspection system 215, a fabrication pattern inspection system 216, and a probe tester 217. The quality control network 213 is connected to a quality control computer (not illustrated). Controllers installed in the fabrication facilities may be directly connected to the quality control network 213.

The quality inspection system 215 is an inspection system for inspecting foreign particles and conducting line width measurements on the wafer 212 fabricated as far as a desired fabrication system by taking at least a lot as the unit. As the quality inspection system 215, an inspection system for conducting optical inspection and an inspection system using an electron beam according to the present invention can be used. The quality inspection system 215 may conduct inspection on-line for the wafer 212 fabricated as far as a desired fabrication system by taking at least a lot as the unit. By applying also an inspection system using an electron beam according to the present invention to measurement of dimensions of a resist pattern (having transparency with respect to light) subjected to exposure development, measurement and inspection results having higher precision as compared with the optical system can be obtained.

By taking at least a lot as the unit for the wafer 212 fabricated as far as a desired fabrication system, the fabrication pattern inspection system 216 inspects a circuit pattern formed on the surface of a wafer or an insulator pattern having through-holes formed therin. As the fabrication pattern inspection system 216, an inspection system for conducting optical inspection and an inspection system using an electron beam according to the present invention can be used. The fabrication pattern inspection system 216 may conduct inspection on-line for the wafer 212 fabricated as far as a desired fabrication system by taking at least a lot as the unit in the same way as the quality inspection system 215. By applying also an inspection system using an electron beam according to the present invention to defect inspection of an insulator pattern having through-holes formed therein, measurement and inspection results having higher precision as compared with the optical system can be obtained.

The probe tester 217 is a device for inspecting all IC chips formed on a completed wafer for electric characteristics. From the probe tester 217, therefore, defect items are detected for each of chips on the wafer.

The quality control computer analyzes inspection results obtained from the quality inspection system 215, the fabrication pattern inspection system 216, and the probe tester 217 via the quality control network 213, thereby estimates the cause of the defect, and determines the fabrication process (fabrication system) giving rise to the defect cause. The information is reported to the terminal of the fabrication system. Manufacturing conditions are altered and amended so as to prevent the defect from occurring.

A semiconductor is fabricated on a semiconductor substrate (wafer) via a film forming dry process for forming an insulator film such as an interlayer insulator film or a guard film and a wiring metal film, an etching dry process for forming an insulator film pattern having a circuit pattern and through-holes, an exposure development process for conducting resist coating and exposure development and forming a resist pattern, a resist removing process, a planarization process for planarizing the insulator film, and a cleaning process. Therefore, the semiconductor fabrication line is formed by disposing a large number of fabrication systems 1 through n having various processors for implementing the above described processes and controllers for controlling those processors. An electron beam inspection system according to the present invention is disposed between the above described desired fabrication systems. Patterns on wafers fabricated by a fabrication system are inspected by this inspection system. A result of pattern inspection is transmitted to the quality control computer via the quality control network 213. On the basis of this inspection data and past quality control data, the quality control computer inquires into the cause of the defect and reports it to the terminal of the fabrication facility giving rise to the cause of the defect. Upon receiving the report, the terminal conducts countermeasure control depending on the defect cause on the fabrication facility. In order to prevent occurrence of the defect, alteration and amendment (including cleaning) of the fabrication conditions (process processing conditions), i.e., control is effected.

Figure 19:
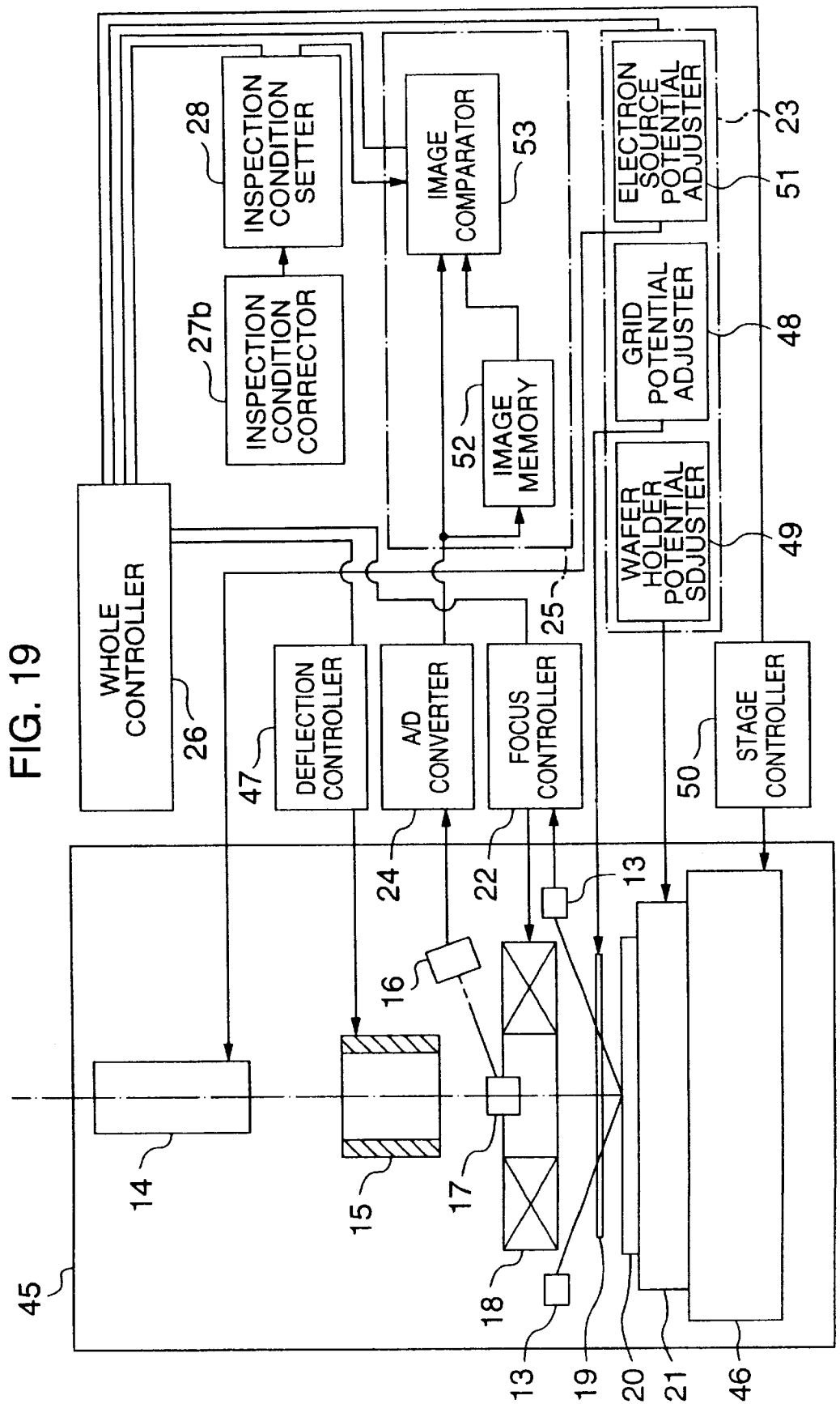
FIG. 19 is a diagram showing a third embodiment of a system for detecting a pattern on an object according to the present invention.

A third embodiment of a system for detecting a pattern on an object such as a semiconductor wafer by using an electron beam according to the present invention will now be described by referring to FIG. 19. The present system (apparatus) includes an electron source 14 for generating an electron beam, a beam deflector 15 for effecting a scan with the electron beam and conducting imaging, an objective lens 18 for focusing the electron beam on a wafer 20 which is the object to be inspected, a potential providing device 19 such as a grid disposed between the objective lens 18 and the wafer 20, a wafer holder 21 for holding the wafer 20 mounted thereon, a stage 46 for scanning and positioning the wafer holder 21, an ExB (a device provided with an electric field E and a magnetic field B) 17 for collecting secondary electrons generated from the surface of the wafer to a secondary electron detector 16, a height sensor 13, a focus controller 22 for adjusting the focus position of the objective lens 18 on the basis of the height information of the wafer surface obtained from the height sensor 13, a deflection controller 47 for controlling the beam deflector 15 to conduct scanning with the electron beam, a potential controller 21 including a wafer holder potential adjuster 49 for adjusting the potential $E_0$ of the wafer holder 21, a grid potential adjuster 48 for controlling the potential $E_1$ of the voltage providing device 19 such as a grid, and an electron source potential adjuster 51 for controlling the voltage $E_2$ of the electron source 14, an A/D converter 24 for conducting A/D conversion on a signal supplied from the secondary electron detector 16, an image processor 25 including an image memory 52 and an image comparator 53 to process the digital image subjected to A/D conversion in the A/D converter 24, an inspection condition corrector 27b for correcting the inspection conditions on the basis of the surface section structure of the object obtained from the design information, an inspection condition setter 28 for setting and storing inspection conditions corrected and chosen by the inspection condition corrector 27b, a stage controller 50 for controlling the stage 46, a whole controller 26 for controlling the whole of them, and an inspection vacuum chamber 45 for housing the electron source 14, the beam deflector 15, the objective lens (electric optics) 18, the voltage providing device 19 such as the grid, and the wafer 20 which is the object (sample). FIG. 19 differs from FIG. 16 in existence of the inspection condition corrector 27b.

The sequence of the present system is shown in FIG. 14C. In this scheme, inspection conditions are preset on the basis of a plurality of materials forming the object 20 to be inspected.

The correction of the inspection conditions conducted in the inspection condition corrector 27b will now be described. As shown in FIGS. 1 and 10, the CPU 131 theoretically calculates dependence of the secondary electron yield ratio η upon the acceleration voltage E on the sample and the electric field α on the sample for a plurality of materials forming the surface section structure over the kinds of the object on the basis of experimental values inputted by using the input device 135, and stores the dependence in the external storage device 137. Subsequently, a plurality of materials (a material located in the upper layer and a material located in the lower layer) forming the surface section structure according to the kind of the object to be inspected are specified by using the input device 135. The CPU 131 searches for inspection conditions (potential values $E_0$, $E_1$ and $E_2$) having a value contained in a small permissible value range around unity (i.e., having a value equal to approximately unity) as the secondary electron yield ratio η of the specified material located in the upper layer, having a value contained in a predetermined permissible value range such as the range of 0.7 to 1.2 as the secondary electron yield ratio η of the material located in the lower layer, and having a proper value as the difference (contrast ρ) from the secondary electron yield ratio η of the material located in the upper layer. The CPU 131 stores such inspection conditions (potential values $E_0$, $E_1$ and $E_2$) in the external storage device 137 as proper inspection conditions (step 37d). As a matter of course, a group of proper inspection conditions according to the kind are stored in the external storage device 137 over kinds of the object to be inspected.

Actual inspection of wafers will now be described. Before actually inspecting a wafer, inspection conditions corresponding to the kind (including the variety and process) of a wafer to be inspected are chosen out of the group of the inspection conditions (potential values $E_0$, $E_1$ and $E_2$) stored in the external storage device 137 and stored in the RAM 134. Subsequently, the wafer to be actually inspected is loaded in response to a command issued by the whole controller 26 (step 31d). Alignment is conducted (step 32d). Thereafter, the inspection conditions stored in the inspection condition setter 28 are read out. Each of the potential values $E_0$, $E_1$ and $E_2$ is thus controlled by the wafer holder potential adjuster 49, the grid potential adjuster 48, and the electron source potential adjuster 51 forming the potential controller 23. The focus offset determined by the conditions is set by the focus controller 22 (step 34d). After this setting, the stage 46 is driven in the Y direction at a predetermined speed under the control of the stage controller 50 in response to a command given from the whole controller 26. (As for this scan in the Y direction, scanning using the beam deflector 15 may be used together therewith.) While the stage 46 is being thus driven in the Y direction, scanning is conducted in the X direction with the electron beam supplied from the electron source 14 by using the beam deflector 15 under the control of the deflection controller 47. Consecutive two-dimensional image signals are detected from the second electron detector 16, and converted to two-dimensional digital image signals by the A/D converter 24. The two-dimensional digital image signals are stored in the image memory 52 included in the image processor 25. Among detected two-dimensional digital image signals and two-dimensional digital image signals stored in the image memory 52, image signals expected to be originally the same (such as image signals of each of repeated chips, blocks, or unit areas (which may include a pattern)) are compared with each other by the image comparator 53. Different portions are judged to be defective on the basis of the inspection standard (judgment standard) and recorded in a memory included in the image processor 25 or the whole controller 26 (step 35d). If all places to be inspected on a wafer 20 have been inspected, the wafer is unloaded (step 36d).

In a first variant of the present embodiment, inspection conditions (potential values $E_0$, $E_1$ and $E_2$) obtained as a result of search using only the information of the object to be inspected are not applied as they are. Instead, calibration is conducted by using the scheme described before with reference to the second embodiment (correction of inspection conditions based upon digital image signals obtained by detecting secondary electrons generated from the surface of the object to be inspected) in the neighborhood of inspection conditions (potential values $E_0$, $E_1$ and $E_2$) obtained by searching. Thereby, inspection conditions suitable for the surface section structure of an actual wafer can be calculated. In other words, the charge-up phenomenon not only depends on the material of the pattern in the surface section structure but also changes according to the shape or thickness of the upper layer pattern. According to the present variant, accurate inspection conditions can be set in the shortest time.

In the present embodiment as well, working effects similar to those of the above described embodiment can be obtained. In other words, wafers of various varieties and processes can be inspected under optimum inspection conditions. The present embodiment can be applied not only to a specific variety but also to wafers obtained in a plurality of processes.

Figure 20:
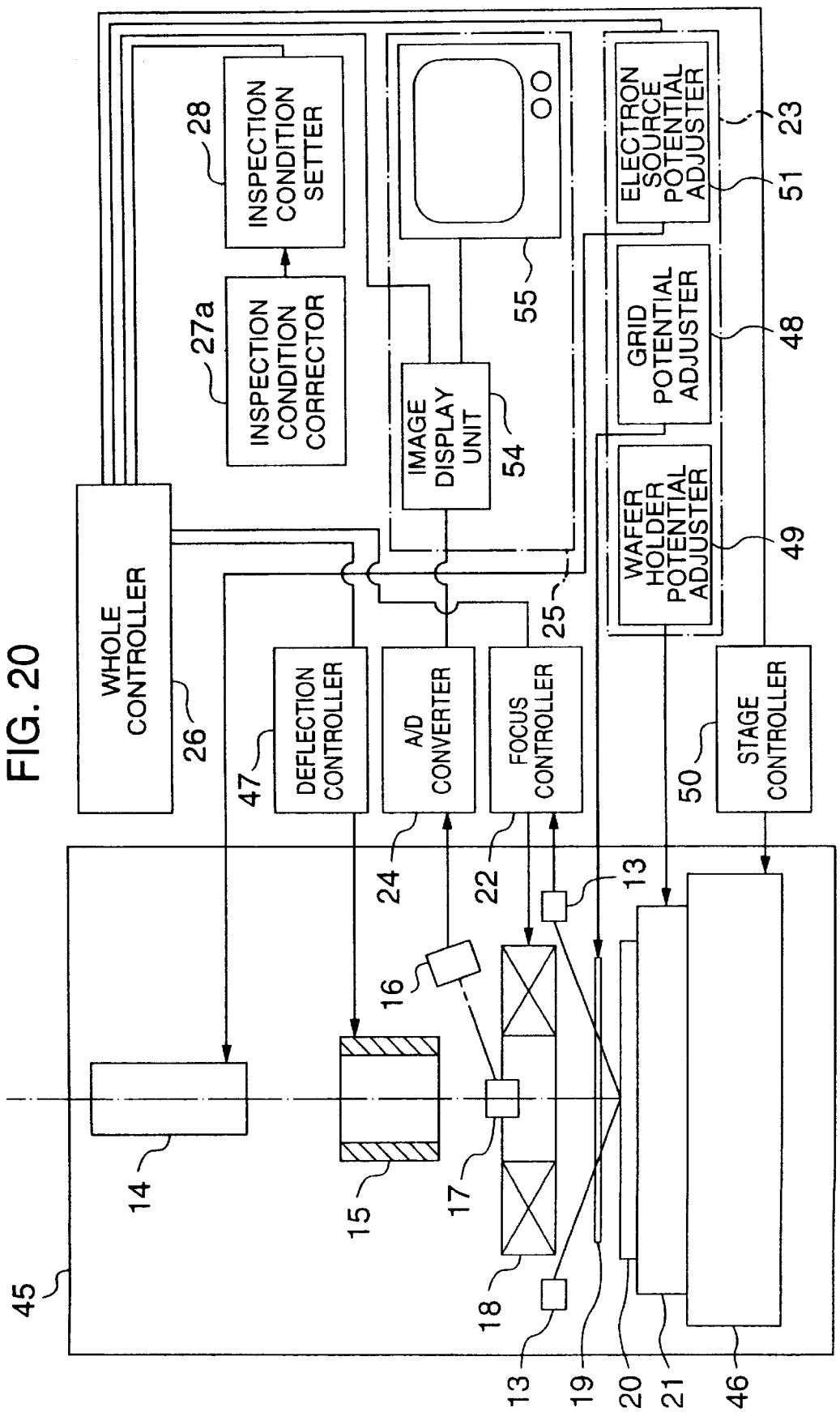
FIG. 20 is a diagram showing a fourth embodiment of a system for detecting a pattern on an object according to the present invention.

A fourth embodiment of the system for detecting (observing) a pattern on the object such as a semiconductor wafer by using an electron beam according to the present invention will now be described by referring to FIG. 20. FIG. 20 is a schematic configuration diagram showing an embodiment of an observation SEM according to the present invention. The present system (apparatus) includes an electron source 14 for generating an electron beam, a beam deflector 15 for effecting a scan with the electron beam and conducting imaging, an objective lens 18 for focusing the electron beam on an object 20, a potential providing device 19 such as a grid disposed between the objective lens 18 and the object, a wafer holder 21 for holding the object 20 mounted thereon, a stage 46 for scanning and positioning the object 20, an E×B (a device provided with an electric field E and a magnetic field B) 17 for collecting secondary electrons generated from the surface of the object to a secondary electron detector 16, a height sensor 13, a focus controller 22 for adjusting the focus position of the objective lens 18 on the basis of the height information of the object surface obtained from the height sensor 13, a deflection controller 47 for controlling the beam deflector 15 to conduct scanning with the electron beam, a potential controller 21 including a wafer holder potential adjuster 49 for adjusting the potential $E_0$ of the wafer holder 21, a grid potential adjuster 48 for controlling the potential $E_1$ of the voltage providing device 19 such as a grid, and an electron source potential adjuster 51 for controlling the voltage $E_2$ of the electron source 14, an A/D converter 24 for conducting A/D conversion on a signal supplied from the secondary electron detector 16, an image display unit 54 for displaying digital images obtained by A/D conversion conducted in the A/D converter 24 on a monitor 55 such as a display, an inspection condition corrector 27b for correcting the inspection conditions on the basis of the surface section structure of the object obtained from the design information, an inspection condition setter 28 for setting and storing inspection conditions corrected and chosen by the inspection condition corrector 27b, a stage controller 50 for controlling the stage 46, a whole controller 26 for controlling the whole of them, and an inspection vacuum chamber 45 for housing the electron source 14, the beam deflector 15, the objective lens (electric optics) 18, the voltage providing device 19 such as the grid, and the wafer 20 which is the object (sample). FIG. 20 differs from FIGS. 16 and 18 in that the image display unit 54 and the monitor 55 are provided instead of the image processor 25. Since the inspection condition corrector 27b also has the monitor (display device) 136 in addition to the function of the image display unit 54, the monitor (display device) 136 can be used instead of the monitor 55.

As shown in FIG. 14C, the sequence of the present system is similar to that of the third embodiment. However, the inspection at the step 35d is conducted as hereafter described. In accordance with an order given by the operator, the stage 46 is driven in the Y direction at a predetermined speed under the control of the stage controller 50 in response to a command given from the whole controller 26. (As for this scan in the Y direction, scanning using the beam deflector 15 may be used together therewith.) While the stage 46 is being thus driven in the Y direction, scanning is conducted in the X direction with the electron beam supplied from the electron source 14 by using the beam deflector 15 under the control of the deflection controller 47. Consecutive two-dimensional image signals are detected from the second electron detector 16, and converted to two-dimensional digital image signals by the A/D converter 24. The two-dimensional digital image signals are stored in the image memory 52 installed in the image display unit 54. The image display unit 54 cuts out a specified image out of image signals stored in the image memory, and enlarges and displays the image on the monitor 55 to present the image to the operator. Therefore, the operator can observe a specific partial image on the surface of the object with enlargement. According to the present embodiment, the surface of the object can be observed under such a condition that charge-up is not caused at any time, irrespective of a change of the material of the surface of the object.

Figure 21:
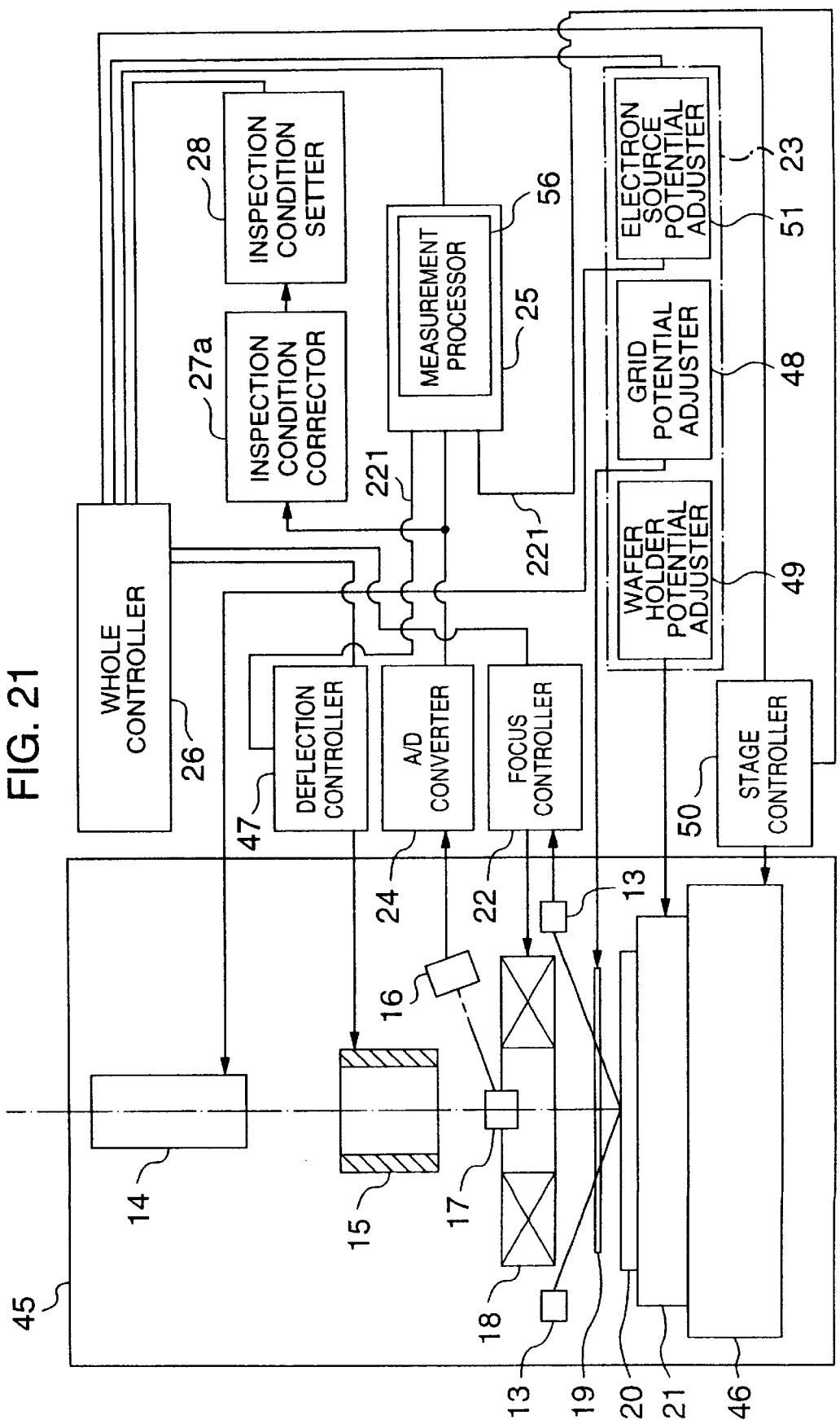
FIG. 21 is a diagram showing a fifth embodiment of a system for detecting a pattern on an object according to the present invention.

A fifth embodiment of the system for detecting a pattern on the object such as a semiconductor wafer by using an electron beam according to the present invention will now be described by referring to FIG. 21. FIG. 21 is a schematic configuration diagram showing an embodiment of an pattern length measuring apparatus for inspecting dimensions of a pattern according to the present invention. The present system (apparatus) includes an electron source 14 for generating an electron beam, a beam deflector 15 for effecting a scan with the electron beam and conducting imaging, an objective lens 18 for focusing the electron beam on an object 20, a potential providing device 19 such as a grid disposed between the objective lens and the object, a wafer holder 21 for holding the object 20, a stage 46 carrying the wafer holder 21 to scan and position the object 20, an E×B (a device provided with an electric field E and a magnetic field B) 17 for collecting secondary electrons generated from the surface of the object to a secondary electron detector 16, a height sensor 13, a focus controller 22 for adjusting the focus position of the objective lens 18 on the basis of the height information of the object surface obtained from the height sensor 13, a deflection controller 47 for controlling the beam deflector 15 to conduct scanning with the electron beam, a potential controller 21 including a wafer holder potential adjuster 49 for adjusting the potential $E_0$ of the wafer holder 21, a grid potential adjuster 48 for controlling the potential $E_1$ of the voltage providing device 19 such as a grid, and an electron source potential adjuster 51 for controlling the voltage $E_2$ of the electron source 14, an A/D converter 24 for conducting A/D conversion on a signal supplied from the secondary electron detector 16, an image processor 25 including an image memory for storing a digital image obtained by the A/D conversion in the A/D converter 24 and an measurement processor 56 for measuring dimensions of a predetermined pattern on the basis of the digital image stored in the image memory, an inspection condition corrector 27a for correcting the inspection conditions so as to correspond to the surface section structure of the object on the basis of the digital image obtained from the A/D converter 24, an inspection condition setter 28 for setting and storing inspection conditions corrected and chosen by the inspection condition corrector 27a, a stage controller 50 for controlling the stage 46, a whole controller 26 for controlling the whole of them, and an inspection vacuum chamber 45 for housing the electron source 14, the beam deflector 15, the objective lens (electric optics) 18, the voltage providing device 19 such as the grid, and the wafer 20 which is the object (sample). FIG. 21 differs from FIGS. 16 and 19 in that dimensions of the pattern on the object to be inspected are measured in the image processor 25. For measuring the dimensions of the pattern in the image processor 25, there are needed data of the deflection value (scan value) of the electron beam supplied from the deflection controller 47 to the beam deflector 15 and the displacement value (travel value) representing the value of the travel of the stage effected by the stage controller 50. Therefore, data (position information) 221 of the deflection value (scan value) of the electron beam supplied from the deflection controller 47 to the beam deflector 15 and the displacement value (travel value) representing the value of the travel of the stage effected by the stage controller 50 are inputted to the image processor 25.

As shown in FIG. 14B, the sequence of the present system is similar to that of the second embodiment. At the step 35c, however, the stage 46 is driven in the Y direction at a predetermined speed under the control of the stage controller 50 in response to a command given from the whole controller 26. While the stage 46 is being thus driven in the Y direction, scanning is repetitively conducted at high speed in the X direction with the electron beam supplied from the electron source 14 by using the beam deflector 15 under the control of the deflection controller 47. Consecutive two-dimensional image signals are detected from the secondary electron detector 16, and converted to two-dimensional digital image signals by the A/D converter 24. The two-dimensional digital image signals are stored in the image memory installed in the image processor 25. By using the data (position information) 221 of the deflection value (scan value) of the electron beam supplied from the deflection controller 47 to the beam deflector 15 and the displacement value (travel value) representing the value of the travel of the stage effected by the stage controller 50, dimensions of a desired pattern formed on the surface of the object are measured on the basis of the image data stored in the above described image memory. The results are stored in the memory included in the image processor 25 or the whole controller 26 and outputted and presented to the operator as occasion demands.

According to the present embodiment, patterns on wafers of various varieties and processes can be measured under proper inspection conditions. Dimensions of patterns on not only a wafer of a specific variety but also wafers obtained in a plurality of processes can be measured accurately. As a result, the present embodiment can be used as the quality inspection system shown in FIG. 18. In the midcourse of a fabrication process, fine widths of resist patterns and insulator patterns which cannot be optically measured can be accurately measured. As a result, quality inspection can be implemented.

Figure 22:
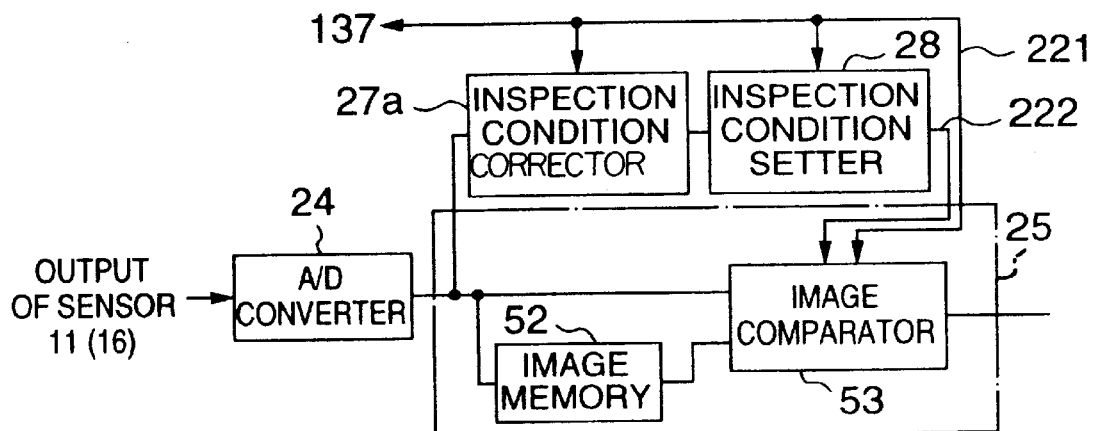
FIG. 22 is a diagram showing a sixth embodiment of a system for detecting a pattern on an object according to the present invention.

Sixth through tenth embodiments of the system for detecting a pattern on the object such as a semiconductor wafer by using an electron beam according to the present invention will now be described by referring to FIGS. 22 through 27. FIG. 22 is a diagram showing a characteristic portion of the sixth embodiment of the system for detecting a pattern on the object such as a semiconductor wafer by using an electron beam according to the present invention. It is now assumed that in the sixth embodiment charge-up has occurred on the surface of the object 20 to be inspected. For the charge-up phenomenon appearing in the digital image signal obtained by converting an image signal using secondary electrons, for example, representing the physical property of the object detected by the sensor 11 (16) as shown in FIGS. 4 through 6, FIG. 8, and FIG. 17, the inspection standard (judgment standard) is changed in the image processor 25. In this way, the influence of this charge-up is mitigated, and inspection can be conducted accurately.

Figure 6D:
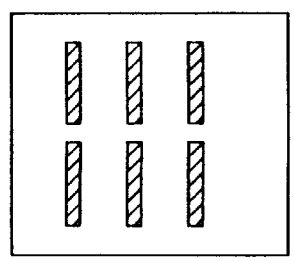
Figure 6E:
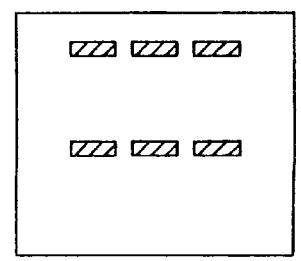

Operation conducted in the inspection condition corrector 27a in the embodiment shown in FIG. 22 will now be described. On the basis of the digital image signal representing the physical property of the object and using secondary electrons, for example, detected by the sensor 11 (16) according to the high-speed scan direction with the electron beam and converted by the A/D converter 24, the CPU 131 extracts a change area of the digital image signal due to charge-up (a change area due to charge-up) as shown in FIGS. 6B or 6C and FIG. 8B, for example, so as to correspond to the high-speed scan direction with the electron beam, for each of kinds differing in surface section structure of object. As occasion demands, the CPU 131 conducts charge-up judgment by deriving average brightness in the above described change area. For each kind of the object to be inspected, the result is stored in the external storage device 137. The extraction of the change area of the digital image signal due to occurrence of charge-up can be implemented by, for example, using two threshold values eliminating the brightness of the upper layer pattern area and eliminating the brightness of the lower layer pattern area. Because the brightness of the change area due to the charge-up lies between the brightness of the upper layer pattern area and the brightness of the lower layer pattern area. In the inspection condition corrector 27a, therefore, two-dimensional mask data (mask signal) indicating the change area due to charge-up for each of repeated chips, blocks or unit areas (as shown in FIGS. 6D, 6E and 8C, for example) are formed in the external storage device 137 for each of kinds of the object so as to be associated with the scan direction of high-speed scan using the electron beam. However, it is desirable to conduct processing for expanding only the change area on the two-dimensional mask data (mask signal) representing the change area generated by charge-up and store it in the external storage device 137 as mask data (mask signal) 222. Furthermore, in repeated chips, blocks or unit areas on the objects of the same kind, there are in some cases surface section structures of a plurality of kinds having different charge-up phenomena. Therefore, it is necessary to prepare two-dimensional mask data so as to accommodate them.

Alternatively, the inspection standard (judgment standard) in the change area due to charge-up may be determined on the basis of the average brightness in the above described change area derived by the CPU 131. Furthermore, the inspection standard (judgment standard) in areas other than the above described change area may be determined on the basis of the image contrast ρ between the upper layer pattern area and the lower layer pattern area.

Actual inspection of the object to be inspected (wafer) will now be described. First of all, the inspection condition setter 28 reads out a mask signal corresponding to the kind of the object specified at the time of actual inspection from the external storage device 137, and sets and stores the mask signal in the RAM 134. Subsequently, the stage 46 is driven in the Y direction at a predetermined speed under the control of the stage controller 50 in response to a command given from the whole controller 26. While the stage 46 is being thus driven in the Y direction, scanning is conducted in the X direction with the electron beam supplied from the electron source 14 by using the beam deflector 15 under the control of the deflection controller 47. Consecutive two-dimensional image signals are detected from the sensor 11 (the second electron detector 16), and converted to two-dimensional digital image signals by the A/D converter 24. The two-dimensional digital image signals are stored in the image memory 52 included in the image processor 25. Among detected two-dimensional digital image signals and two-dimensional digital image signals stored in the image memory 52, image signals expected to be originally the same (such as image signals of each of repeated chips, blocks, or unit areas) are compared with each other by the image comparator 53. At this time, mask data 222 stored in the RAM 134 are read out. On the basis of data (position information) 221 of deflection value (scan value) of the electron beam supplied from the deflection controller 47 to the beam deflector 15 and displacement value (travel value) representing the value of travel of the stage effected by the stage controller 50, the mask data 222 read out is aligned with the two-dimensional digital image signal to be compared. On the basis of the mask data 222, the inspection standard (judgment standard) is made different in the change area from other areas. A portion where the image signals differ from each other is judged to be defective and is recorded in the memory in the image processor 25 or the whole controller 26. In other words, when image signals expected to be originally the same (such as image signals of each of repeated chips, blocks, or unit areas) are compared with each other by the image comparator 53, the inspection standard (judgment standard) is made different in the change area from other areas (for example, the sensitivity is lowered in the change area due to charge-up) on the basis of the mask data 222. As a result, false detection can be prevented even if a change is caused in the detected digital image signal by charge-up.

As shown in FIG. 6, the change area due to charge-up changes mainly in relation to the high-speed scan direction with the electron beam. Therefore, the object 20 to be inspected is rotated by 90 or 180 degrees by rotating the wafer holder 21 by 90 or 180 degrees, for example. The scan direction with the electron beam is thus changed. Consecutive two-dimensional image signals are thus detected again from the sensor 11 (secondary electron detector 16), converted to two-dimensional digital image signals by the A/D converter 24, and inspected in the image processor 25. By doing so, all areas can be inspected with the same inspection standard (judgment standard).

Figure 23:
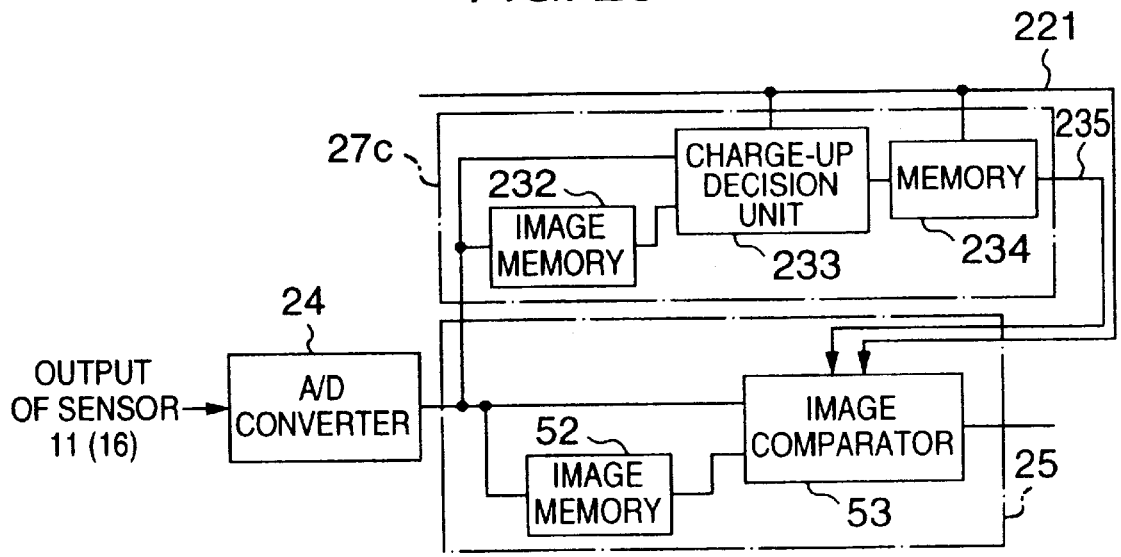
FIG. 23 is a diagram showing a seventh embodiment of a system for detecting a pattern on an object according to the present invention.

FIG. 23 is a diagram showing a seventh embodiment of a system for detecting a pattern on the object such as a semiconductor wafer by using an electron beam according to the present invention. In the seventh embodiment shown in FIG. 24, the object 20 (28) is loaded. In response to a command issued by the whole controller 26, the stage 46 is aligned under the control of the stage controller 50. Thereafter, a certain chip, block, or unit area (which may include a pattern) is scanned once with the electron beam. Consecutive first two-dimensional image signals are detected from the sensor 11 (secondary electron detector 16), converted to first two-dimensional digital image signals by the A/D converter 24, and stored in an image memory 232 included in the inspection condition corrector 27c and the image memory 52 included in the image processor 25. Subsequently, the same chip, block, or unit area (which may include a pattern) is scanned with the electron beam a plurality of times. (The high-speed scan direction may be changed.) Consecutive second two-dimensional image signals are detected from the sensor 11 (secondary electron detector 16), and converted to second two-dimensional digital image signals by the A/D converter 24. In a charge-up decision unit 233 formed by a CPU and included in the inspection condition corrector 27c, difference values between the first two-dimensional digital image signals stored in the image memory 232 (133) and the second two-dimensional digital image signals are calculated. Two-dimensional mask data (mask signal) representing the change area due to charge-up (as shown in FIGS. 6D, 6E and 8C, for example) are formed and stored in a memory 234. However, it is desirable to conduct processing of expanding only the change area on the two-dimensional mask data (mask signal) representing the change area due to charge-up and store the result in the memory 234 as mask data (mask signal) 235. The inspection standard (judgment standard) in the change area due to charge-up may be determined on the basis of average brightness in the change area derived by the charge-up decision unit 233. Furthermore, the inspection standard (judgment standard) in areas other than the above described change area may be determined on the basis of the image contrast ρ between the upper layer pattern area and the lower layer pattern area. Until the mask data 235 are thus created in the inspection condition corrector 27c, inspection is not executed in the image comparator 53.

Actual inspection of the object to be inspected (wafer) becomes similar to that of the embodiment shown in FIG. 22. In response to a command issued by the whole controller 26, the stage 46 is driven in the Y direction at a predetermined speed under the control of the stage controller 50. While the stage 46 is being thus driven in the Y direction, scanning is conducted in the X direction with the electron beam supplied from the electron source 14 by using the beam deflector 15 under the control of the deflection controller 47. Consecutive two-dimensional image signals having repetitions of a chip, block, or a unit area are detected from the sensor 11 (the second electron detector 16), and converted to two-dimensional digital image signals by the A/D converter 24. Among detected two-dimensional digital image signals and the first two-dimensional digital image signals stored in the image memory 52, image signals expected to be originally the same (such as image signals of each of repeated chips, blocks, or unit areas) are compared with each other. At this time, mask data 235 stored in the memory 234 are read out. On the basis of data (position information) 221 of deflection value (scan value) of the electron beam supplied from the deflection controller 47 to the beam deflector 15 and displacement value (travel value) representing the value of the travel of the stage effected by the stage controller 50, the mask data 235 read out is aligned with the first two-dimensional digital image signal to be compared. On the basis of the mask data 235, the inspection standard (judgment standard) is made different in the change area from other areas. A portion where the image signals differ from each other is judged to be defective and is recorded in the memory in the image processor 25 or the whole controller 26. In other words, when image signals expected to be originally the same (such as image signals of each of repeated chips, blocks, or unit areas) are compared with each other, the inspection standard (judgment standard) is made different in the change area from other areas (for example, the sensitivity is lowered in the change area due to charge-up) on the basis of the mask data 235. As a result, false detection can be prevented even if a change is caused in the detected digital image signal by charge-up.

As shown in FIG. 6 and FIG. 17, the change area due to charge-up changes mainly in relation to the high-speed scan direction with the electron beam. Therefore, the object 20 to be inspected is rotated by 90 or 180 degrees by rotating the wafer holder 21 by 90 or 180 degrees, for example. The scan direction with the electron beam is thus changed. Consecutive two-dimensional image signals are thus detected again from the sensor 11 (secondary electron detector 16), converted to two-dimensional digital image signals by the A/D converter 24, and inspected in the image processor 25. By doing so, all areas can be inspected with the same inspection standard (judgment standard).

Figure 24:
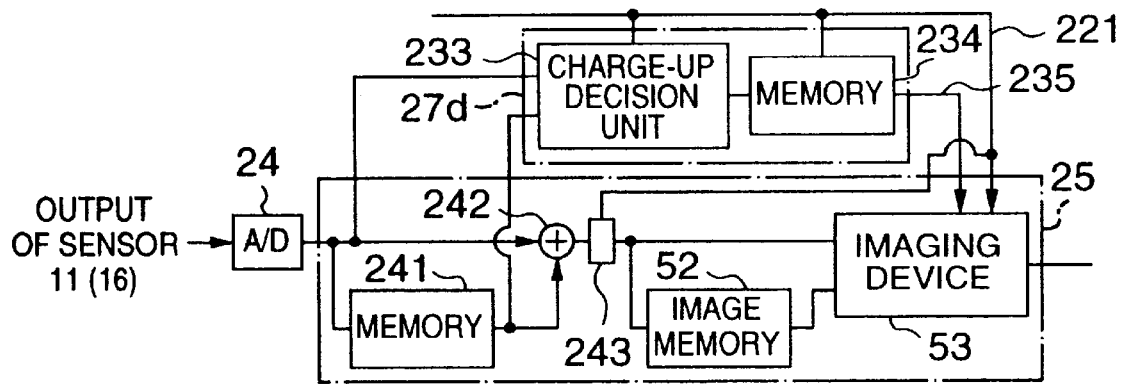
FIG. 24 is a diagram showing an eighth embodiment of a system for detecting a pattern on an object according to the present invention.

FIG. 24 is a diagram showing an eighth embodiment of a system for detecting a pattern on the object such as a semiconductor wafer by using an electron beam according to the present invention. In the eighth embodiment of FIG. 24, the same line is scanned on the surface of the object with an electron beam. While a reciprocating scan is being conducted or a scan is being conducted twice to effect a two-dimensional scan, consecutive two-dimensional image signals having repeated chips, blocks or unit areas are detected from the sensor 11 (secondary electron detector 16) and converted to two-dimensional digital image signals by the A/D converter 24. Numeral 241 denotes a memory for storing a digital image signal of one preceding scan line obtained from the A/D converter 24 as a result of the reciprocating scan or scanning twice. The memory 241 is formed by a shift register. Numeral 242 denotes an image addition circuit for adding together the digital image signal of one preceding scan line obtained from the memory 241 and the digital image signal of one succeeding scan line obtained from the A/D converter 24. In the case of reciprocating scan, it is necessary in the image addition circuit 242 to read out the digital image signal of one preceding scan line from the memory 241 with inversion of 180 degrees. Numeral 243 denotes a gate circuit, which is closed during the preceding scan included in the reciprocating scan or two scans.

In the embodiment shown in FIG. 24, the object 20 (28) to be inspected is loaded. In response to a command issued by the whole controller 26, the stage 46 is aligned under the control of the stage controller 50. Thereafter, a certain chip, block, or unit area (which may include a pattern) is scanned with the electron beam in a two-dimensional way by effecting a reciprocating scan or effecting two scans. Consecutive two-dimensional image signals for the reciprocating scan or two scans are detected from the sensor 11 (secondary electron detector 16), and converted to two-dimensional digital image signals for the reciprocating scan or two scans by the A/D converter 24. For the chip, block, or unit area, a difference between the two-dimensional digital image signal based upon a preceding scan line in the reciprocating scan or two scans obtained from the memory 241 and the two-dimensional digital image signal based upon a succeeding scan line in the reciprocating scan or two scans obtained from the A/D converter 24 is calculated in a charge-up decision unit 233 formed by a CPU and other components and included in an inspection condition corrector 27d. Two-dimensional mask data (mask signals) representing the change area due to charge-up (as shown in FIGS. 6D, 6E and 8C) are thus formed and stored in a memory 234. However, it is desirable to conduct processing of expanding only the change area on the two-dimensional mask data (mask signals) representing the change area due to charge-up and store the result in the memory 234 as mask data (mask signal) 235.

Actual inspection of the object (wafer) to be inspected is conducted in the same way as the embodiments shown in FIGS. 22 and 23. Since the two-dimensional digital image signal to be inspected is obtained by addition conducted in the addition circuit 242, the signal-to-noise ratio is improved and inspection with high reliability can be implemented. As the scan using the electron beam becomes complicated, however, it becomes necessary to align the digital image signal obtained by the reciprocal scan or two scans more accurately.

Figure 25:
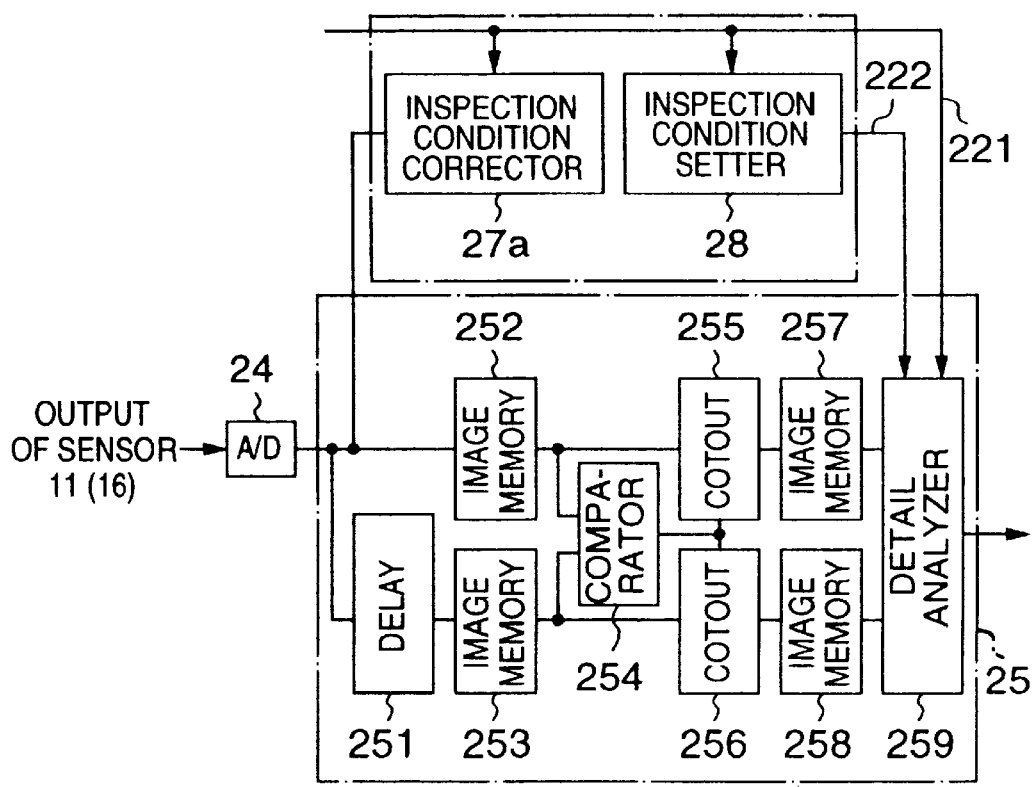
FIG. 25 is a diagram showing a ninth embodiment of a system for detecting a pattern on an object according to the present invention.

FIG. 25 is a diagram showing a ninth embodiment of a system for detecting a pattern on the object such as a semiconductor wafer by using an electron beam according to the present invention. In the ninth embodiment shown in FIG. 26, image signals expected to be originally the same (such as image signals of each of repeated chips, blocks, or unit areas) are compared with each other and defect candidates are detected as noncoincidence in an image comparator 254. Two compared images including defect candidates are cut out respectively by cutout circuits 255 and 256 and stored temporarily respectively in image memories 257 and 258. In a detail analyzer 259, the inspection standard (judgment standard) is altered by using the two-dimensional mask data (mask signal) representing the change area due to charge-up. In this way, attention is paid to charge-up and it is made possible to inspect real minute defects.

A delay circuit 251 functions to delay the digital image signals by a value corresponding to repeated chips, blocks or unit areas. The delay circuit 251 is formed by a shift register, for example. Each of the image memories 252 and 253 functions to store digital images of an area formed by a plurality of scan lines. An image comparator 254 functions to compare the image signals respectively stored in the image memories 252 and 253 and expected to be originally the same and extract defect candidates as noncoincidence. The cutout circuits 255 and 256 function to cut out digital image signals including defect candidates extracted by the image comparator 254 from the image memories 252 and 253 and store them in the image memories 257 and 258, respectively. The detail analyzer 259 conducts detailed analysis of digital images including defect candidates cut out respectively in the image memories 257 and 258 by altering the inspection standard (judgment standard) on the basis of the two-dimensional mask data (mask signal) representing the change area due to charge-up obtained from the inspection condition setter 28. Thus the detail analyzer can inspect real minute defects. In the case where it takes a long time for detail analysis, it is possible in the present embodiment to inspect real minute defects without synchronism with the occurrence of images detected from the sensor 11 (secondary electron detector 16) and without being significantly affected by charge-up. Especially for detecting real minute defects, it is necessary to align digital images with each other more accurately than the minute defect size to be detected. For that purpose, position deviation detection also becomes necessary. Furthermore, it is necessary to extract a plurality of features by using a plurality of parameters and effect judgment on the basis of inspection standard (judgment standard) prepared so as to conform to the extracted feature. Thus, it takes a long time to conduct detail analysis.

Figure 26:
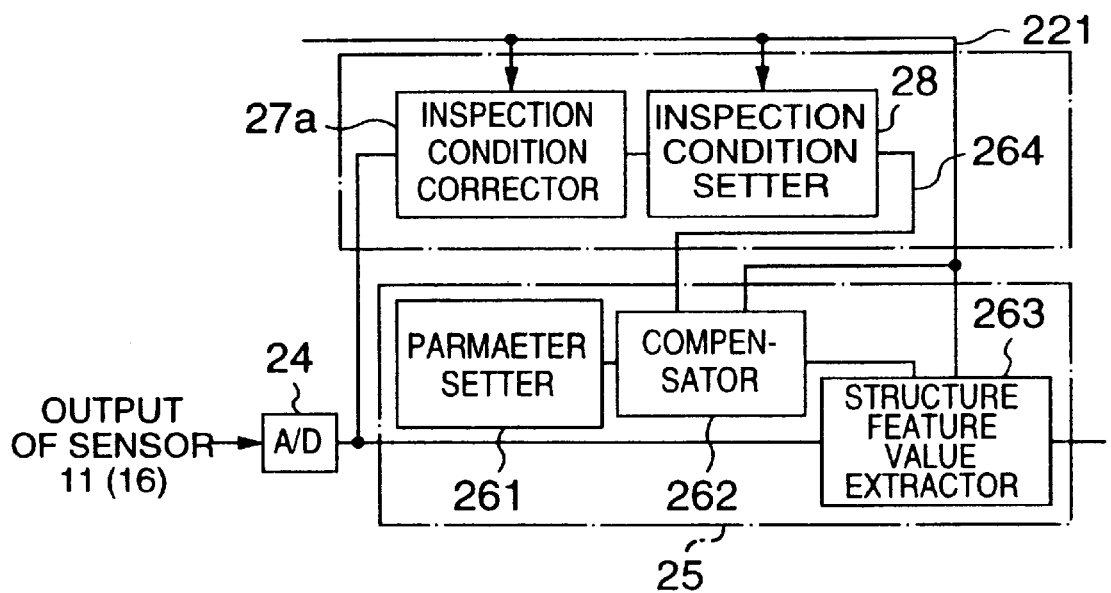
FIG. 26 is a diagram showing a tenth embodiment of a system for detecting a pattern on an object according to the present invention.

FIG. 26 is a diagram showing a tenth embodiment of a system for detecting a pattern on the object such as a semiconductor wafer by using an electron beam according to the present invention. It is now assumed that a shrunk pattern is detected in the detected image due to charge-up as shown in FIG. 5B. In the case where image signals for each of repeated chips, blocks, or unit areas are compared with each other, patterns are shrunk in the same way in the compared image signals and consequently defects can be detected as noncoincidence. In the case where the structural features of pattern dimensions (such as a pattern width or thickness) are extracted, however, it is necessary to alter parameters for extracting structural features according to a change incurred in the detected image by charge-up.

The tenth embodiment in this case will now be described by referring to FIG. 26. A reference target (reference sample) having the same surface section structure (especially the same material) as the object to be inspected and having dimensions measured by using another method and already known is placed on the wafer holder 21. The reference target is scanned with an electron beam in a two-dimensional way. Two-dimensional image signals are detected from the sensor 11 (secondary electron detector 16) and converted to two-dimensional digital image signals by the A/D converter 24. In the inspection condition corrector 27a, a feature value such as a dimension of the reference target is calculated on the basis of the converted two-dimensional digital image signals, and a difference between it and a feature value such as a dimension of the reference target already known is derived. As shown in FIG. 5B, for example, a change rate of the feature value such as the shrinkage ratio of the pattern due to charge-up is calculated and stored in the external storage device 137. In the case where there are a large number of surface section structures, it is possible to reduce the number of prepared reference targets by grouping and conduct interpolation or compensation in each group by using design information of the surface section structure of the object to be inspected.

In the inspection condition setter 28, a change rate 264 of the feature value according to the surface section structure of the object to be inspected is read out and set. As for parameter setter 261 included in the image processor 25, various parameters for structural feature extraction such as pattern dimensions (such as the pattern width and pattern thickness) according to the kind of the surface section structure of the object to be inspected are inputted thereto and stored therein. By specifying the kind of the object to be inspected, a parameter suitable for the desired kind of the object to be inspected is read out of various parameters for structural feature extraction such as pattern dimensions set and stored in the parameter setter 261. A compensator 262 executes compensation on the parameter thus read out according to the change rate 264 of the feature value.

In an image detected under a specific condition, the feature value to be measured changes. This change rate is read into the parameter setter 261. The change rate is applied in the compensator 262 to the measured feature value. The measured feature value is thus compensated to become a real value.

On the basis of the compensated parameter, a structural feature value extractor 263 extracts the feature value (such as pattern dimensions) of the surface section structure from the two-dimensional digital image signal of the object 20 (28) obtained from the A/D converter 24. In other words, the structural feature value extractor 263 extracts the feature value of the surface section structure of the object on the basis of the data (position information) 221 of deflection value (scan value) of the electron beam supplied from the deflection controller 47 to the beam deflector 15 and displacement value (travel value) representing the value of the travel of the stage effected by the stage controller 50. In the structural feature value extractor 263, the parameter for extracting the structural feature value is thus compensated. As a result, the structural feature value on the surface of the object to be inspected can be extracted with due regard to the charge-up phenomenon occurring on the surface of the object 20 (28) to be inspected.

By comparing the structural feature value (such as pattern dimensions) extracted in the structural feature value extractor 263 with the inspection standard (judgment standard), inspection can be executed.

Figure 27:
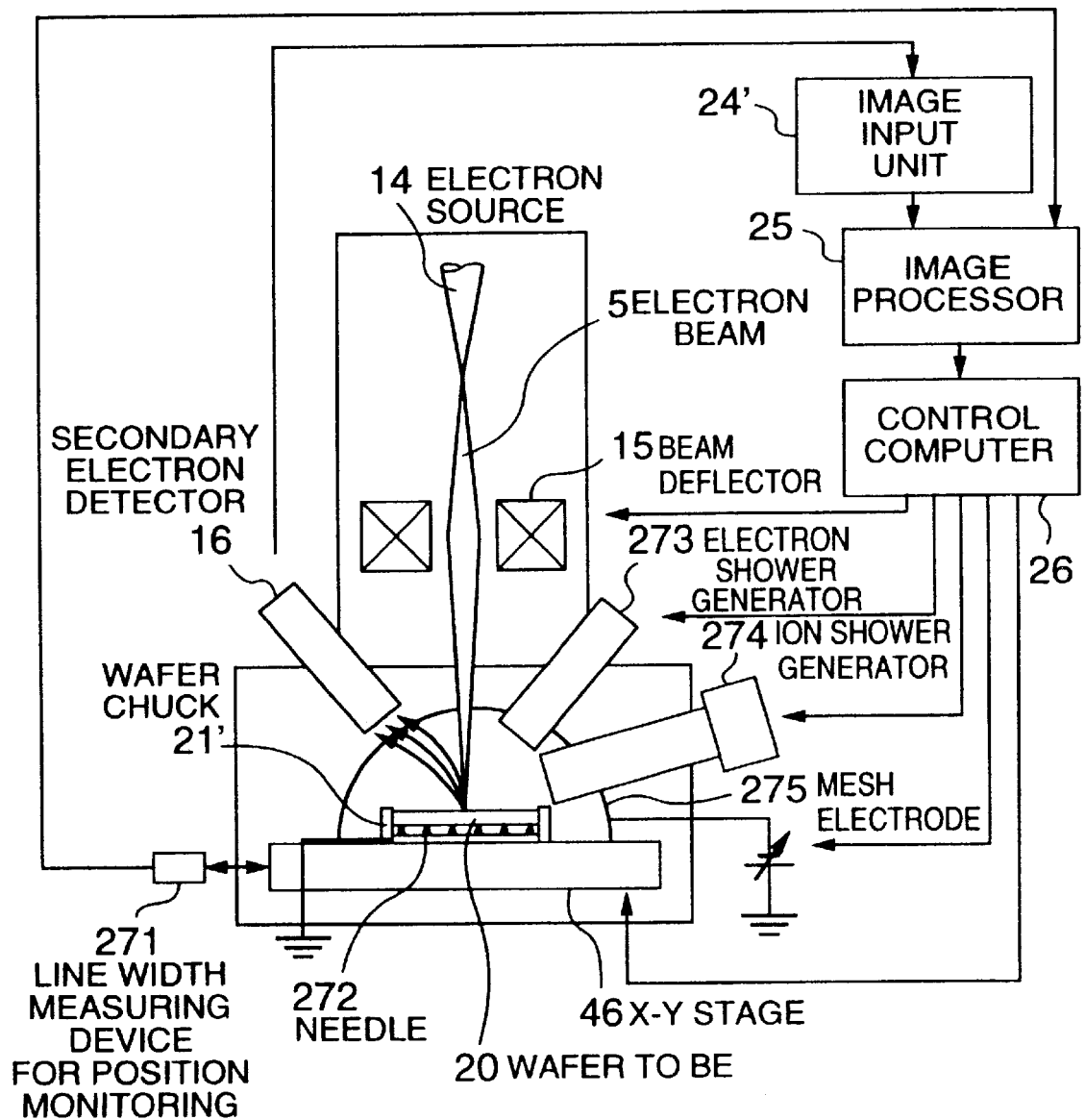
FIG. 27 is a diagram showing an eleventh embodiment of a system for detecting a pattern on an object according to the present invention.

An eleventh embodiment of a system for detecting a pattern on an object such as a semiconductor wafer by using an electron beam according to the present invention will now be described by referring to FIG. 27. Numeral 14 denotes an electron source, and numeral 15 denotes a beam deflector. Numeral 16 denotes a secondary electron detector. Numeral 21' denotes a wafer chuck for supporting an object 20 to be inspected such as a wafer with needles connected to the ground. Therefore, electric charges of the electrified object 20 to be inspected are released through the needles 272. The charge-up ease phenomenon thus occurs. Numeral 46 denotes an X-Y stage. Numeral 271 denotes a line width measuring device for position monitoring which detects the position of the X-Y stage 46 and position coordinates on the object 20 to be inspected. Numeral 273 denotes an electron shower generator. The electron shower generator 273 blows an electron shower against the object 20 to such a degree that secondary electrons are not generated. The electron shower generator 273 thus counteracts positive charge-up and prevents occurrence of charge-up. Numeral 274 denotes an ion shower generator. The ion shower generator 274 blows an ion shower against the object 20 to such a degree that secondary electrons are not generated. The ion shower generator 274 thus counteracts negative charge-up and prevents occurrence of charge-up. Numeral 275 denotes a mesh electrode provided with negative potential. When a desired place of the object 20 to be inspected is exposed to the focused electron beam 5, the mesh electrode 275 functions to cause the secondary electron detector 16 to detect properly secondary electrons generated from the surface of the object 20 to be inspected. Numeral 24' denotes an image input unit for inputting two-dimensional secondary electron image signals detected by the secondary electron detector 16. The image input unit 24' includes an A/D converter 24. Numeral 25 denotes an image processor including the image memory 52 and the image comparator 53. On the basis of the two-dimensional secondary electron image signals inputted to the image input device 24' and the position coordinates on the object 20 obtained from the length measuring device 271 for position monitoring, the image processor 25 inspects the upper layer pattern and the like. Numeral 26 denotes a control computer (whole controller). The control computer 26 controls voltages supplied to the beam deflector 15, the X-Y stage 46, the electron shower generator 273, the ion shower generator 274, and the mesh electrode 275. Especially, the control computer (whole controller) 26 must effect control so as to prevent electrons and ions blown by the electron shower generator 273 and the ion shower generator 274 from affecting the secondary electron signals detected by the secondary electron detector 16.

The eleventh embodiment may also be applied to the above described first to tenth embodiments. In the first to tenth embodiments, charges stored on the surface of the object 20 are counteracted by the electrons and ions blown by the electron shower generator 273 and the ion shower generator 274. In the detected images based upon secondary electrons or back-scattered electrons, therefore, contrast, for example, can be kept in a nearly constant state temporally.

The embodiments heretofore described bring about such an effect that it is possible to mitigate the charge-up phenomenon and charge-up ease phenomenon caused when an object is exposed to an electron beam, set inspection conditions suitable for the surface section structure of the object, and execute reliable inspection, measurement and image display of the object.

The embodiments heretofore described bring about such an effect that it is possible to set inspection conditions suitable for the charge-up phenomenon and charge-up ease phenomenon caused when an object is exposed to an electron beam, and execute reliable inspection, measurement and image display of the object.

The embodiments heretofore described bring about such an effect that semiconductor substrates in the middle of fabrication can be actually inspected in the semiconductor fabrication line and consequently highly reliable semiconductors can be obtained stably by using results of the inspection as control data for fabrication facilities forming the semicondutor fabrication line.

We claim:

1. An electron beam inspection method comprising the steps of:

irradiating an electron beam to an object to be inspected;

detecting at least one of a secondary electron and a reflected electron emanated from the object by the irradiation of the electron beam;

obtaining an image of the object from the detected electron;

controlling at least one of an acceleration voltage of the electron beam and an electric field in a neighborhood of the object based on the obtained image of the object so as to control the contrast of the image;

exposing the object to the electron beam with the controlled acceleration voltage;

detecting at least one of a secondary electron and reflected electron emanated from the object by the irradiation of the electron beam in the controlled electric field; and conducting inspection or measurement of the object on the basis of a detected signal of the detection in the controlled electric field.

2. An electron beam inspection method according to claim 1, wherein said acceleration voltage of the electron beam is in the range of 0.3 to 5 kV.

3. An electron beam inspection method according to claim 1, wherein said electric field in the neighborhood of the object is 5 kV/mm or less.

4. An electron beam inspection method according to claim 1, wherein the steps of detecting include detecting the secondary electron emanated from the object, and the step of obtaining an image of the object is obtained from the detected secondary electron.

5. An electron beam inspection method according to claim 1, further comprising the steps of: displaying a signal representing the detected signal by the detection in the controlled electric field on a display means.

6. An electron beam inspection method according to claim 1, further comprising the steps of detecting a height of the object, and controlling a focus of the electron beam irradiating the object based on the detected height of the object.

7. An electron beam inspection method according to claim 1, wherein the step of controlling further includes at least one of controlling an electric field on the object, a beam current, an image detection rate, image dimensions, pre charge of the surface of the object and discharge of the surface of the object.

8. An electron beam inspection apparatus comprising:

an electron source;

a beam deflector for deflecting an electron beam emitted from said electron source;

a height detector for detecting a height of a surface of an object to be inspected;

an objective lens for focusing the electron beam emitted from said electron source upon the object using an output from the height detector;

potential control means for controlling at least one of an acceleration voltage of the electron beam and an electric field in a neighborhood of the object;

a sensor for detecting at least one of a secondary electron and reflected electron emanated from the object by the irradiation of the electron beam; and image processing means for conducting inspection or measurement of the object using an output from the sensor.

9. An electron beam inspection apparatus according to claim 8, further comprising display means for displaying a signal of an output from the sensor.

10. An electron beam inspection apparatus according to claim 8, wherein the potential control means controls at least one of an acceleration voltage of the electron beam and an electric field in a neighborhood of the object on a basis of an output of the image processing means.

11. An electron beam inspection apparatus according to claim 8, wherein the control means controls at least one of an acceleration voltage of the electron beam, an electric field in a neighborhood of the object, a current of the electron beam, a diameter of the electron beam, an image detection rate of the sensor, image dimensions in the control means, pre-charge on the surface of the object and discharge on the surface of the object.

12. An electron beam inspection apparatus comprising:

an electron source;

a beam deflector for deflecting an electron beam emitted from said electron source;

a height detector for detecting a height of a surface of an object to be inspected;

an objective lens for focusing the electron beam emitted from said electron source upon the object using an output from the height detector;

a sensor for detecting a at least one of a secondary electron and reflected electron emanated from the object, upon exposure of the object to the electron beam;

an inspection condition creation means for creating inspection conditions corresponding to a charge-up phenomenon on a surface of the object;

image processing means for conducting inspection or measurement of the object using an output from the sensor.

13. An electron beam inspection apparatus according to claim 12, wherein the inspection condition creation means provides the surface of the object with a pre-charge or discharge.

14. A semiconductor fabrication method comprising the steps of:

controlling at least one of an acceleration voltage of an electron beam and an electric field in a neighborhood of an object;

detecting a height of a surface of the object by a height detection unit;

adjusting a focus of the electron beam using a result of the detection by the height detection unit;

exposing the object to the electron beam with the controlled acceleration voltage;

detecting in a sensor at least one of a secondary electron and reflected electron emanated from the object generated from a semiconductor substrate as the object in response to said controlled electric field; and conducting inspection or measurement of the semiconductor substrate on the basis of a signal representing the detected at least one of a secondary electron and reflected electron emanated from the object and thereby fabricating the semiconductor substrate.

15. A semiconductor fabrication method comprising the steps of:

controlling an acceleration voltage of an electron beam on a sample, an electric field on the sample, a beam current, a beam diameter, an image detection rate, image dimensions, pre-charge, discharge or a combination of them;

detecting a height of a surface of the sample by a height detection unit;

adjusting a focus of the electron beam using a result of the detection by the height detection unit;

exposing a semiconductor substrate as the sample to the electron beam;

detecting in a sensor at least one of a secondary electron and reflected electron emanated from the semiconductor substrate; and conducting inspection or measurement of the semiconductor substrate on the basis of a signal representing the detected at least one of a secondary electron and reflected electron emanated from the object and thereby fabricating the semiconductor substrate.

16. A semiconductor fabrication method comprising the steps of:

detecting a height of a surface of the semiconductor substrate by a height detection unit;

adjusting a focus of the electron beam using a result of the detection by the height detection unit;

exposing the semiconductor substrate to the electron beam;

detecting in a sensor at least one of a secondary electron and reflected electron emanated from the semiconductor substrate; and conducting inspection or measurement of the semiconductor substrate on the basis of a signal representing the detected at least one of a secondary electron and reflected electron emanated from the object under inspection conditions corresponding to a charge-up phenomenon on the surface of the semiconductor substrate and thereby fabricating the semiconductor substrate.

17. A semicondutor fabrication method according to one of claims 14, 15, or 16, wherein a result of said inspection or measurement is analyzed and fed back to a predetermined process.

18. An electron inspection method, comprising the steps of:

utilizing an object to be inspected comprising a conductive member and a dielectric member, at least one of the conductive member and the dielectric member being subjected to charge up when an electron beam is incident on the object;

setting an accelerating voltage of the electron beam and an electric field in a neighborhood of the object so as to substantially prevent the at least one of the conductive member and the dielectric member from being charged up when the electron beam is incident on the object;

exposing the object to the electron beam so that the electron beam is incident on the object;

detecting at least one of a secondary electron and reflected electron emanated from the object in response to the electron beam being incident on the object; and conducting inspection or measurement of the object in accordance with the detected at least one of a secondary electron and reflected electron.

19. An electron beam inspection method, comprising the steps of:

utilizing an object to be inspected comprising at least two members thereon;

setting an accelerating voltage of the electron beam so that secondary electron yield ratios of each of the at least two members is substantially equal to 1 when the electron beam is incident on the object;

exposing the object to the electron beam so that the electron beam is incident on the object;

detecting a secondary electron emanated from the object in response to the electron beam being incident on the object; and conducting inspection or measurement of the object in accordance with the detected secondary electron.

20. An electron beam inspection method according to claim 19, wherein the step of setting an accelerating voltage of the electron beam is based on a detected secondary electron emanated from the object by the incidence of the electron beam.

21. An electron beam inspection method according to claim 19, wherein the step of setting further includes setting an electric field in a neighborhood of the object.

* * * * *